(12) United States Patent
Kirby

(10) Patent No.: US 7,332,413 B2
(45) Date of Patent: *Feb. 19, 2008

(54) SEMICONDUCTOR WAFERS INCLUDING ONE OR MORE REINFORCEMENT STRUCTURES AND METHODS OF FORMING THE SAME

(75) Inventor: Kyle K. Kirby, Boise, ID (US)

(73) Assignee: Micron Tecnology, Inc., Boise, ID (US)

( * ) Notice: Subject to any disclaimer, the term of this patent is extended or adjusted under 35 U.S.C. 154(b) by 0 days.

This patent is subject to a terminal disclaimer.

(21) Appl. No.: 11/516,095

(22) Filed: Sep. 5, 2006

(65) Prior Publication Data

US 2007/0004173 A1 Jan. 4, 2007

Related U.S. Application Data

(63) Continuation of application No. 10/931,847, filed on Aug. 31, 2004, now Pat. No. 7,244,663.

(51) Int. Cl.
*H01L 21/30* (2006.01)

(52) U.S. Cl. ............... 438/459; 438/455; 438/456; 438/977

(58) Field of Classification Search ........... 438/455, 438/457–459, 462, 464, 977; 257/618, 619, 257/620, 622, 496
See application file for complete search history.

(56) References Cited

U.S. PATENT DOCUMENTS

| 3,475,867 A | 11/1969 | Walsh |
| 3,492,763 A | 2/1970 | Walsh |
| 4,853,286 A | 8/1989 | Narimatsu et al. |
| 4,946,716 A | 8/1990 | Corrie |
| 5,085,009 A | 2/1992 | Kinumura et al. |
| 5,127,984 A | 7/1992 | Hua et al. |
| 5,256,599 A | 10/1993 | Asetta et al. |
| 5,268,065 A | 12/1993 | Grupen-Shemansky |
| 5,273,940 A | 12/1993 | Sanders |
| 5,324,687 A | 6/1994 | Wojnarowski |
| 5,389,579 A | 2/1995 | Wells |
| 5,476,566 A | 12/1995 | Cavasin |
| 5,480,842 A | 1/1996 | Clifton et al. |
| 5,508,206 A | 4/1996 | Glenn et al. |
| 5,656,552 A | 8/1997 | Hudak et al. |
| 5,851,845 A | 12/1998 | Wood et al. |
| 5,851,902 A | 12/1998 | Sakai |
| 5,888,838 A | 3/1999 | Mendelson et al. |

(Continued)

*Primary Examiner*—Kevin M. Picardat
(74) *Attorney, Agent, or Firm*—TraskBritt

(57) ABSTRACT

Methods of forming semiconductor devices include thinning a region of a semiconductor wafer and forming at least one semiconductor die laterally within a thinned region of the wafer. One or more reinforcement structures may be defined on the wafer. Semiconductor wafers include one or more reinforcement structures that extend laterally along the wafer and project from at least one surface of the wafer. The wafers further include a plurality of at least partially formed semiconductor dice laterally within at least one region having a thickness that is less than a thickness of the reinforcement structures. The wafers may include a plurality of at least partially formed semiconductor dice laterally within each of a plurality of thin regions defined between a plurality of reinforcement structures. The thin regions may have an average thickness less than an average thickness of the reinforcement structures.

20 Claims, 14 Drawing Sheets

U.S. PATENT DOCUMENTS

| | | |
|---|---|---|
| 6,013,534 A | 1/2000 | Mountain |
| 6,017,822 A | 1/2000 | Mountain |
| 6,023,094 A | 2/2000 | Kao et al. |
| 6,030,485 A | 2/2000 | Yamada |
| 6,046,073 A | 4/2000 | Lang et al. |
| 6,074,896 A | 6/2000 | Dando |
| 6,184,064 B1 | 2/2001 | Jiang et al. |
| 6,238,515 B1 | 5/2001 | Tsujimoto et al. |
| 6,245,677 B1 | 6/2001 | Haq |
| 6,251,705 B1 | 6/2001 | Degani et al. |
| 6,268,237 B1 | 7/2001 | Flesher et al. |
| 6,297,131 B1 | 10/2001 | Yamada et al. |
| 6,426,275 B1 | 7/2002 | Arisa |
| 6,506,681 B2 | 1/2003 | Grigg et al. |
| 6,608,370 B1 | 8/2003 | Chen et al. |
| 6,713,366 B2 | 3/2004 | Mong et al. |
| 2006/0046438 A1* | 3/2006 | Kirby .................. 438/464 |

* cited by examiner

SEMICONDUCTOR WAFERS INCLUDING ONE OR MORE REINFORCEMENT STRUCTURES AND METHODS OF FORMING THE SAME

CROSS-REFERENCE TO RELATED APPLICATION

This application is a continuation of application Ser. No. 10/931,847, filed Aug. 31, 2004, now U.S. Pat. No. 7,244,663, issued Jul. 17, 2007.

BACKGROUND OF THE INVENTION

1. Field of the Invention

The present invention relates to semiconductor wafer structures and methods for fabricating same. Particularly, the present invention relates to a thinned semiconductor wafer structure including at least one structure providing reinforcement therefor.

2. Background of Related Art

Semiconductor wafer thinning techniques have been developed in response to an ever-increasing demand for smaller-sized, higher-performance semiconductor devices. For example, operation of semiconductor devices may generate relatively large amounts of heat. Accordingly, heat must be removed from a semiconductor device to avoid failure or performance degradation thereof due to excessive temperatures or a deleterious thermal environment.

One way to enhance heat transfer away from a semiconductor device and mitigate deleterious thermal effects is by thinning the semiconductor wafer on which the device is fabricated. Other reasons for thinning a semiconductor device may include dimensional packaging constraints (such as for, by way of example only, use in cell phones, personal digital assistants (PDAs) notebook computers and the like), optimization of transmission line characteristics, and reduction of the length of via holes extending transversely through the thickness of the device. Semiconductor devices may be thinned while the devices are in a wafer form or structure (i.e., prior to dicing). However, one undesirable consequence of thinning a semiconductor wafer is increased fragility thereof due to the inherently brittle nature of semiconductor materials. In turn, increased fragility of a semiconductor wafer may undesirably influence handling during the thinning operation, thereafter, or both.

Furthermore, due to the relatively high cost of semiconductor handling equipment, and correspondingly high investment therein, it will almost always be preferred to utilize, at least for a period of time, existing semiconductor handling equipment for handling thinned semiconductor wafers. Of course, such semiconductor handling equipment will have likely been designed for full thickness semiconductor wafers and, therefore, may not perform optimally or even suitably for handling thinned semiconductor wafers.

One conventional approach for addressing the fragility of a thinned semiconductor water is to mount a semiconductor wafer to a support layer or other support structure prior to thinning, wherein the support structure, alone or in combination with the semiconductor wafer structure itself, provides structural support for handling of the semiconductor wafer, as well as protection of a semiconductor wafer surface. Also, the support structure in combination with the thinned semiconductor wafer may be configured to exhibit dimensions substantially similar to a conventional, unthinned semiconductor wafer, which may facilitate handling thereof by conventional semiconductor wafer handling equipment.

For example, a conventional support structure may be affixed to a semiconductor wafer by first coating a major surface of the wafer with an adhesive material and bonding the support structure to the semiconductor wafer, thus forming a supported semiconductor wafer. In addition to providing structural support for the semiconductor wafer, the support structure may also facilitate handling of the semiconductor wafer. U.S. Pat. No. 3,475,867 to Walsh, entitled "Processing of Semiconductor Wafers," and U.S. Pat. No. 3,492,763 to Walsh, entitled "Method and Apparatus for Mounting Semiconductor Slices," each describes conventional methods and support structures of the type described above, respectively.

A semiconductor wafer, once supported by a conventional support structure may be thinned by either mechanically grinding or chemically etching an exposed surface thereof, typically the back side. However, the use of adhesive material may be undesirable as increasing the potential for introducing contaminants into the process area. In addition, the processing temperatures, which the supported, bonded wafer encounters, must remain below the melting temperature of the adhesive material. Other considerations may include warping or bowing of a semiconductor wafer due to the difference between the coefficients of thermal expansion or stress states of the wafer and the support structure and dicing of the semiconductor wafer.

Another conventional example of methods and apparatus for supporting a semiconductor wafer during or after thinning is U.S. Pat. No. 4,853,286 to Narimatsu et al. and entitled "Wafer Processing Film," which patent discloses providing a wafer processing film comprising a base film having a Shore D hardness of 40 or less and an adhesive layer disposed on one surface of the base film for supporting wafers such as silicon and similar wafers during grinding thereof.

Further, U.S. Pat. No. 5,476,566 to Cavasin, entitled "Method for Thinning a Semiconductor Wafer" discloses a laminated semiconductor wafer structure for providing mechanical support to a wafer during and after thinning. According to such a configuration, a semiconductor wafer is affixed to a UV-transparent support substrate with a double-sided adhesive tape, the tape having dissimilar adhesives on its two sides. Subsequent to thinning, the support substrate and the tape are removed from the wafer by exposing the laminated structure to UV radiation.

Also, U.S. Pat. No. 5,508,206 to Glenn et al., entitled "Method of Fabrication of Thin Semiconductor Device" discloses thin semiconductor devices, such as thin solar cells, and a method of fabricating same. First, material layers for forming the solar cell are formed over substantially a surface of a wafer or substrate. Then, a microblasting procedure is employed to thin the opposite surface of the semiconductor wafer or substrate, wherein fine abrasive particles are used to etch away wafer material through a mask. Thick areas remain at the perimeter of the semiconductor device or solar cell, in regions of the semiconductor device or solar cell behind the front interconnect attachment pads, and at corresponding rear interconnect attachment areas. In addition, there are thick areas in a pattern that comprise interconnected beams that support the thin wafer areas.

Accordingly, it would be advantageous to provide a semiconductor wafer structure for supporting a relatively thin semiconductor wafer and methods for forming same.

Further, it would be advantageous for the methods to employ processing acts of reduced complexity and time requirements and which may be compatible with existing automated wafer handling systems.

BRIEF SUMMARY OF THE INVENTION

One aspect of the present invention relates to a method of forming a semiconductor wafer. Particularly, a semiconductor wafer may be provided and a plurality of separate semiconductor dice may be fabricated upon a surface thereof. Further, at least one region of the semiconductor wafer may be thinned, wherein thinning the at least one region includes forming at least one reinforcement structure for reinforcing the semiconductor wafer after thinning. Forming the at least one reinforcement structure may comprise forming a plurality of reinforcement ribs. Optionally, a resist layer may be formed and patterned upon a surface of the semiconductor wafer prior to thinning thereof using an etching technique. In one embodiment, a first portion of wafer material of relatively greater thickness extending from a first surface of a thinned region of the semiconductor wafer and a second portion of wafer material of relatively greater thickness extending from a second, opposing surface of the thinned region of the semiconductor wafer may be defined in the wafer material to comprise the at least one reinforcement structure.

Another aspect of the present invention relates to a semiconductor wafer. Particularly, the semiconductor wafer may comprise at least one thinned region and at least one reinforcement structure of relatively greater thickness. The at least one reinforcement structure may comprise at least one reinforcement rib having a first portion of wafer material of relatively greater thickness extending from a first surface of the at least one thinned region of the semiconductor wafer and a second portion of wafer material of relatively greater thickness extending from a second, opposing surface of the at least one thinned region of the semiconductor wafer. Optionally, the first portion and the second portion of the reinforcement structure may be respectively sized and configured so as to position a neutral axis of the at least one reinforcement rib at a selected location. In one embodiment, the first portion and the second portion may be substantially laterally aligned, or superimposed, with respect to a major plane of the semiconductor wafer. In a further aspect of the present invention, the first portion and the second portion may be substantially symmetrical about the at least one thinned region or may be positioned in asymmetrical relationship.

The present invention also contemplates a method of designing a thinned, reinforced semiconductor wafer. Specifically, at least one region of a semiconductor wafer may be selected for thinning. Further, remaining, unthinned regions of the semiconductor wafer may be selected for forming at least one reinforcement structure. Additionally, at least one semiconductor die may be selected for disposition within the at least one thinned region. The configuration, orientation and positioning of the at least one reinforcement structure may be selected in relationship to an anticipated moment or force to be applied to the semiconductor wafer after thinning and during processing and handling.

Other features, advantages, and embodiments of the present invention will become apparent to those of skill in the art through consideration of the ensuing description, the accompanying drawings, and the appended claims.

DETAILED DESCRIPTION OF THE INVENTION

The particular embodiments described herein are intended in all respects to be illustrative rather than restrictive. In one aspect of the present invention, at least one reinforcement structure of a semiconductor wafer may comprise a portion of the semiconductor wafer having a greater thickness than at least one selectively thinned region thereof. Put another way, at least one region of a semiconductor wafer may be thinned, while at least another, different region of the semiconductor wafer may exhibit a relatively greater thickness than the at least one thinned region, wherein the at least another, different, thicker region forms at least one reinforcement structure for supporting the semiconductor wafer. Such a configuration may be termed a so-called wafer "skeleton," referring to the relatively thicker reinforcement structure for supporting the semiconductor wafer. Such a reinforcement structure may provide structural integrity for resisting mechanical stresses, such as, without limitation, bending and torsional stresses (developed from forces or moments applied to the semiconductor wafer) so as to reduce the likelihood of mechanical failure of the at least one thinned region of the semiconductor wafer in response to subsequent handling, processing, or both handling and processing thereof.

Figure 1A:
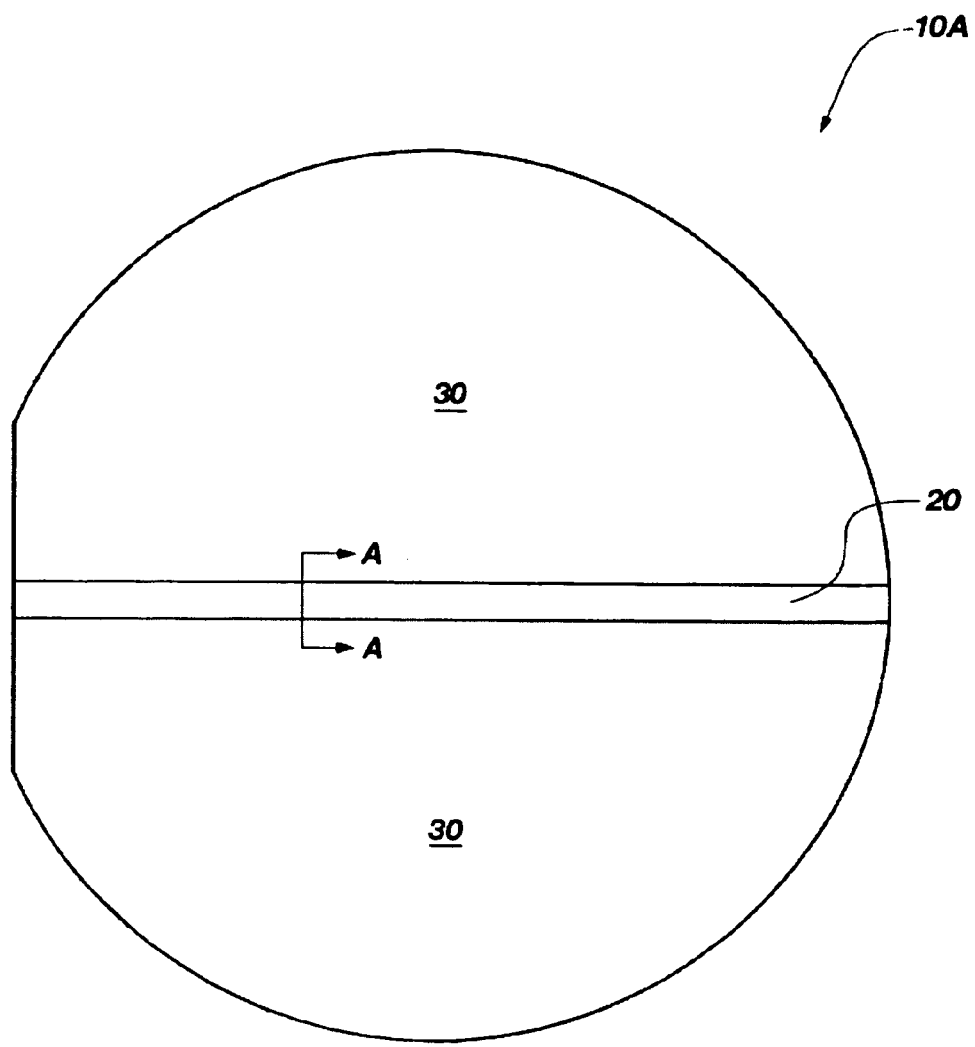
FIG. 1A shows a top elevation view of a semiconductor wafer of the present invention including a reinforcement rib.

For instance, FIG. 1A shows a top elevation view of a semiconductor wafer 10A according to the present invention, including a reinforcement rib 20 defining and separating adjacent thinned regions 30. Each of thinned regions 30 may be sized to accommodate a plurality of semiconductor devices in superimposition therewith. Explaining further, since the thinned regions 30 of the semiconductor wafer 10A may preferably be used for fabrication of semiconductor dice, semiconductor dice may be formed upon either surface thereof.

In further detail, each of the plurality of semiconductor dice (not shown) may be formed so as to be substantially superimposed with a thinned region 30 of the thinned regions 30. Put another way, each individual, separated semiconductor die of the plurality of semiconductor dice may be sized and positioned so that, upon removal of the at least one reinforcement structure, each of the semiconductor dice remains. That is, none of the material layers forming the circuitry of each of the plurality of semiconductor dice is superimposed with the at least one reinforcement rib 20.

Figure 1B:
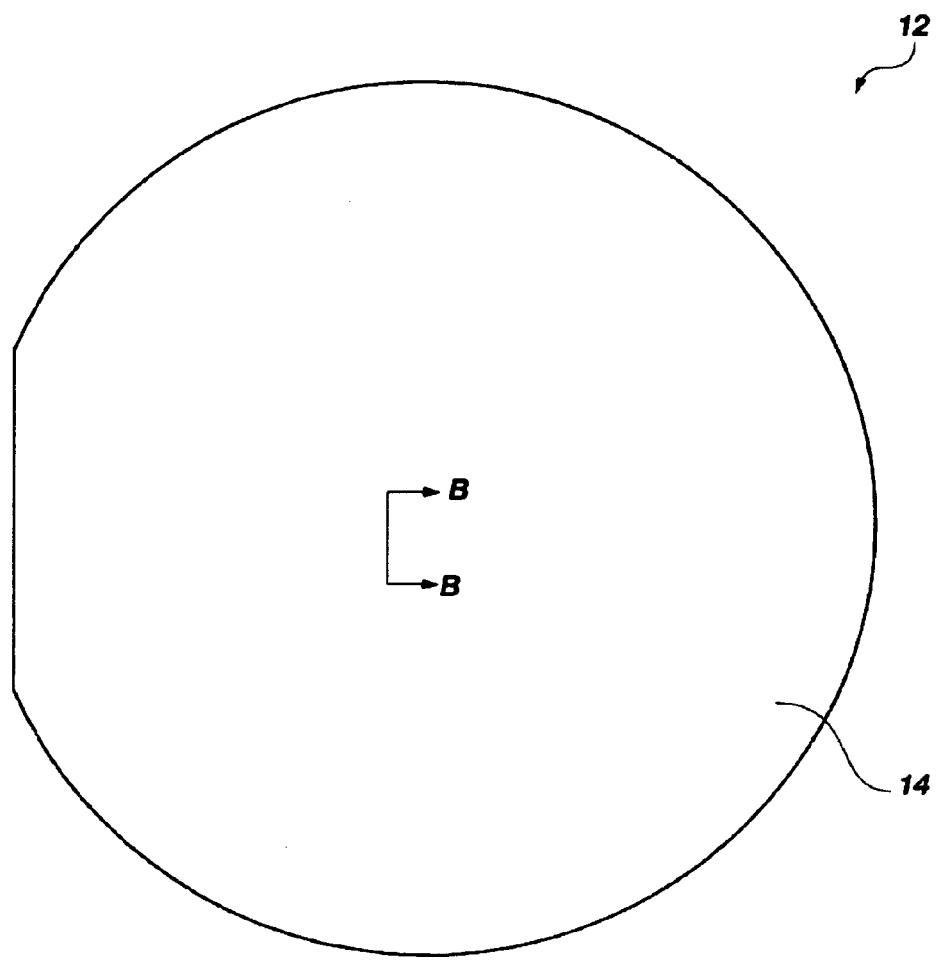
FIG. 1B shows a top elevation view of a semiconductor wafer prior to formation of the at least one reinforcement rib as shown in FIG. 1A.
Figure 1C:
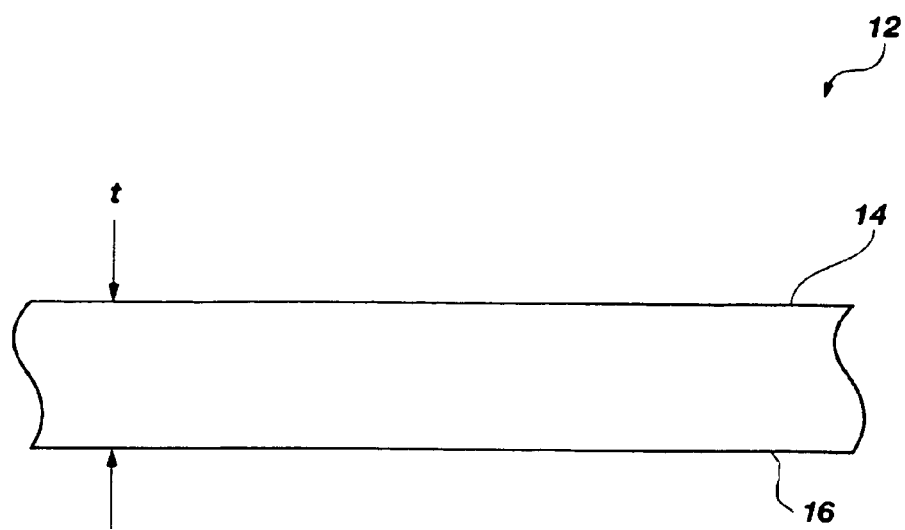
FIG. 1C shows a side cross-sectional view of the semiconductor wafer shown in FIG. 1B, taken along reference line B-B.

FIGS. 1B and 1C each shows an unthinned semiconductor wafer 12 from which semiconductor wafer 10A may have been formed (i.e., prior to thinning). As shown in FIG. 1B in a top elevation view and in FIG. 1C in a side cross-sectional view taken along reference line B-B (FIG. 1B), an unthinned semiconductor wafer 12 may exhibit an initial, substantially uniform thickness (i.e., a layer) labeled "t" as illustrated in FIG. 1C, between a first surface 14 and a second surface 16. By way of example, without limitation, initial thickness t may be about 720 μm-750 μm. Selected regions of unthinned semiconductor wafer 12 having an initial thickness t may be selectively reduced in thickness or thinned to form both the thinned regions 30 and reinforcement rib 20 extending therebetween. Generally, the present invention contemplates that a process for removing material from an unthinned semiconductor wafer 12, as known in the art, may be employed for thinning regions 30 thereof.

For instance, unthinned semiconductor wafer 12 may be thinned by an etching process. Thus, a resist layer (not shown), such as a photoresist layer, may be selectively patterned upon the first surface 14 (FIG. 1C) of unthinned semiconductor wafer 12. Then, an etching process may be performed with respect to the exposed regions of the unthinned semiconductor wafer 12. The exposed regions of unthinned semiconductor wafer 12 may etch anisotropically, meaning that the unthinned semiconductor wafer 12 will etch in depth or thickness to a substantially greater degree than in width or lateral distance etched for a given amount of exposure time to an etchant. Such a configuration may provide substantial retention of the original thickness of regions of the unthinned semiconductor wafer 12 covered by the resist layer (not shown) and a width of the semiconductor material of the wafer lying under the resist, while removing at least a portion of the thickness of the at least one region of unthinned semiconductor wafer 12, which is uncovered by the resist layer. While many resist and etch processes are known in the art, in one example the resist layer may comprise a photoresist, wherein photosensitive film is coated over first surface 14 of unthinned semiconductor wafer 12, exposed to a selected wavelength of light through a mask to define a pattern of the at least one reinforcement structure and developed to fix or cure a portion thereof, the remainder then being removed to expose the surface of the semiconductor wafer. The photoresist may comprise a conventional positive or negative photoresist or, for example, a photopolymer sensitive to exposure to UV-wavelength light. Alternatively, the resist layer may comprise a metal, such as aluminum or copper, a polymer other than a photopolymer (for example, a polyimide) or a hard mask, such as a nitride (e.g., silicon nitride, silicon oxynitride, etc.), an oxide material (e.g., low silane oxide (LSO), a pulse deposition layer comprising aluminum rich oxide, silicon dioxide, etc.), a glass (e.g., borophosphosilicate glass, phosphosilicate glass, borosilicate glass, etc.), or any other resist material as known in the art which may be formed and patterned.

Thus, at least one region of the unthinned semiconductor wafer 12 uncovered by a resist layer (not shown) may be selectively thinned to form thinned regions 30, as shown in FIG. 1A, while one or more different regions of unthinned semiconductor wafer 12 covered by the resist layer may be retained to form reinforcement ribs 20, also as shown in FIG. 1A. As known in the art, the resist layer may be removed or stripped subsequent to the etching process.

In further detail, exemplary etching processes may include wet etching, which may comprise anisotropic or isotropic etching, or dry etching, which typically comprises anisotropic etching. More specifically, by way of example and not by limitation, plasma etching, ion beam etching, ion beam milling, reactive ion etching, chemical dry etching, plasma-enhanced chemical etching, chemical-physical etching, or chemical wet etching may be employed for forming thinned regions 30 and reinforcement ribs 20. For instance, wet etching may be commonly used for forming a desired topography upon a surface of a semiconductor wafer, wherein a typical etchant for a silicon wafer may include hydrofluoric acid, ammonium fluoride, or a mixture thereof. Of course, the etching process and materials may be selected and tailored according to the material comprising unthinned semiconductor wafer 12. Particularly, a typical dry etching process may utilize fluorine atoms (e.g., generated in a discharge of nitrogen trifluoride) to etch an unthinned semiconductor wafer 12 comprising silicon. It may be appreciated that many different etchant variations and process environments are known in the art for etching an unthinned semiconductor wafer 12 comprising a given semiconductor material or materials.

Additionally, a mechanical, abrasive back grind or chemical mechanical planarization (CMP) may be used to remove at least a portion of unthinned semiconductor wafer 12 to form thinned regions 30, as well as to reduce the overall thickness of unthinned semiconductor wafer 12 prior to defining at least one reinforcement structure therein. As a further alternative, abrasive jet (water or air jet) machining or laser ablation may be used to selectively thin at least a portion of an unthinned semiconductor wafer 12 to form thinned regions 30. As an example, it may be desired to back grind an unthinned semiconductor wafer 12 to a thickness t (FIG. 1C) of between about 100-150 µm and, then, subsequently, etch the unthmnned semiconductor wafer 12 until the thickness, $t_0$ (FIGS. 2A and 2B) of thinned regions 30 is between about 10 µm-75 µm.

Thus, the present invention may provide a method of forming at least one reinforcement structure, such as a reinforcement rib, as a portion of an unthinned semiconductor wafer 12 by thinning at least a region thereof (e.g., forming the semiconductor wafer 10A as shown in FIG. 1A).

Figure 2A:
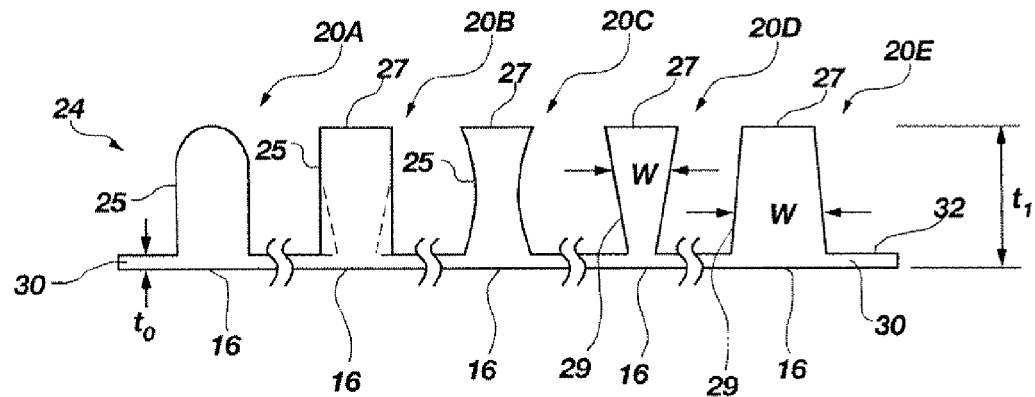
FIG. 2A shows a side cross-sectional view of alternative embodiments of the reinforcement rib shown in FIG. 1A, taken along reference line A-A.

To illustrate another aspect of the present invention, the cross-sectional size and shape of a reinforcement rib 20 (FIG. 1A) may be varied. For example, FIG. 2A depicts exemplary examples in respective partial cross-sectional views (e.g., along reference line A-A of FIG. 1A) thereof, of reinforcement ribs 20A-20E. Thus, a reinforcement rib 20 as shown in FIG. 1A or as otherwise shown or described herein may be configured according to any of the cross-sectional embodiments of reinforcement ribs 20A-20E, as shown in FIG. 2A, without limitation.

Further, a reinforcement rib of the present invention may be formed to exhibit a different cross-section at different positions along a longitudinal extent thereof, to modify strength characteristics thereof in different regions of the semiconductor wafer. In addition, different ribs may, as a whole, be formed with different cross-sections to exhibit greater or lesser rigidity and resistance to, for example, bending or torsion. Different techniques may be used to form reinforcement ribs of different cross-sections, or more than one process used to first define and then modify a cross-section of a reinforcement rib or a portion thereof. For example, an anisotropic etch may be used to form a reinforcement rib having a substantially rectangular cross-section and vertical sidewall and then an abrasive jet, a laser beam or other directed energy technique used to undercut a portion or all of the reinforcement rib sidewall, as shown in broken lines in reinforcement rib 20B of FIG. 2A. Of course, the directed energy may be used to transition, or feather, one cross-section to another to avoid stress concentrations in the wafer material.

Particularly, FIG. 2A shows a reinforcement rib 20A having substantially straight or vertical side walls 25 and a distal end 24 (in relation to the surface 32 of thinned region 30) that is rounded or arcuate. Such a configuration may occur in response to the etching conditions and processes employed for forming thinned regions 30. In another example, reinforcement rib 20B is shown including substantially vertical side walls 25 and a distal end 24 (in relation to the surface 32 of thinned region 30), having a substantially planar and substantially parallel end surface 27 (with respect to the surface 32 of thinned region 30) thereon. In yet a further example, FIG. 2A depicts reinforcement rib 20C, which has arcuate side walls 25 and a distal end 24 (in relation to the surface 32 of thinned region 30), having a substantially parallel and substantially planar end surface 27, with respect to the surface 32 of thinned region 30, thereon. Also, in another example, FIG. 2A shows a reinforcement rib 20D having tapered side walls 29, wherein the lateral width, labeled "w" increases with distance from surface 32 of thinned region 30. Reinforcement rib 20D includes distal end 24 (in relation to the surface 32 of thinned region 30) having a substantially parallel and substantially planar end surface 27, with respect to the surface 32 of thinned region 30, thereon. Furthermore, in another example, FIG. 2A shows a reinforcement rib 20E having tapered side walls 29, wherein the lateral width, labeled "w" decreases with distance from surface 32 of thinned region 30. Reinforcement rib 20E includes distal end 24 (in relation to the surface 32 of thinned region 30) having a substantially planar and parallel end surface 27, with respect to the surface 32 of thinned region 30, thereon. These varying transverse cross-sectional configurations may be effectuated using one or more of the aforementioned, different techniques for thinning of a semiconductor wafer. With wet etching in particular, cross-sectional configurations of a reinforcement rib are susceptible to modification through the use of etchants selective, or preferential, for one crystallographic plane of the semiconductor material of a wafer over another crystallographic plane.

Substantially parallel end surface 27 of any of reinforcement ribs 20B-20E may include a portion of the first surface 14 of unthinned semiconductor wafer 12, as shown in FIG. 1C. Put another way, any of reinforcement ribs 20B-20E may exhibit a thickness $t_1$ substantially equal to the initial thickness (labeled "t" in FIG. 1C) of an unthinned semiconductor wafer 12 between parallel surface 27 and second surface 16, respectively. Likewise, reinforcement rib 20A may exhibit a thickness $t_1$ substantially equal to the initial thickness (labeled "t" in FIG. 1C) of an unthinned semiconductor wafer 12 between its most distal extent (in relation to the surface 32 of thinned region 30) to second surface 16. Alternatively, any of reinforcement ribs 20A-20E may exhibit a thickness $t_1$ of less than t, which may be the result of, as noted above, grinding or chemical mechanical planarization of the original, unthinned semiconductor wafer prior to fabrication of reinforcement ribs thereon. Furthermore, it should be noted that a semiconductor wafer according to the present invention may include reinforcement ribs having different thicknesses or depths. Such a structure may be effected, for example, by preliminarily defining ribs and thinning a semiconductor wafer 12 using a mask-patterned resist, and then selectively removing the resist from the surface of some ribs or portions thereof while leaving the resist on other rib surfaces, and then recommencing etching to thin the thinned regions to their final thickness while simultaneously reducing reinforcement rib thickness of the now-unmasked portions thereof.

Additionally, as discussed hereinabove, since a reinforcement structure of the present invention may be formed in response to a resist and etch process, it may be desirable to leave a resist layer upon a reinforcement structure after etching of a semiconductor wafer. Such a configuration may provide structural support to a thinned semiconductor wafer of the present invention in excess of the structural support that would be provided by a reinforcement structure alone.

Figure 2B:
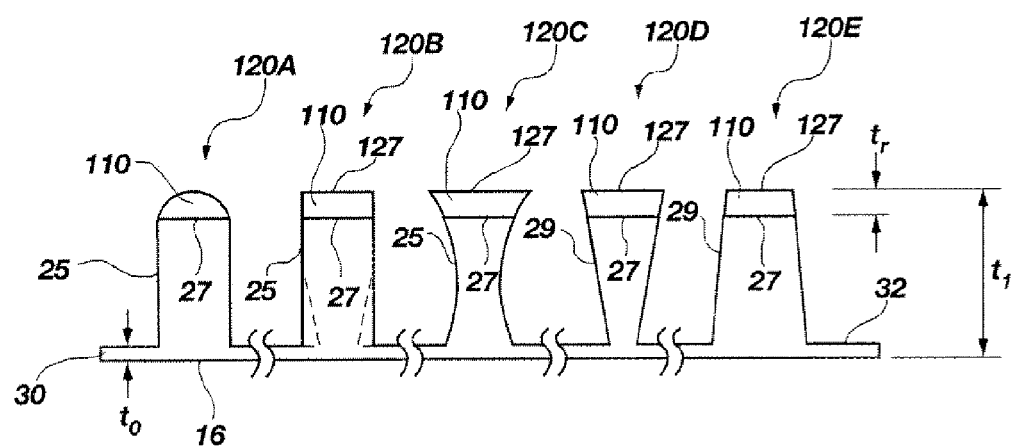
FIG. 2B shows a side cross-sectional view of alternative embodiments of the reinforcement rib as shown in FIG. 2A, including a resist layer thereon, respectively.

Accordingly, for instance, as shown in FIG. 2B, a resist layer 110 used to define each of reinforcement ribs 120A, 120B, 120C, 120D, and 120E on a semiconductor wafer 10A (FIG. 1A) may define the end surface 127 of each of reinforcement ribs 120A, 120B, 120C, 120D, and 120E, respectively. Generally, reinforcement ribs 120A, 120B, 120C, 120D, and 120E may be generally structured as described above in relation to reinforcement ribs 20A, 20B, 20C, 20D, and 20E, respectively, but each may also include a resist layer 110 disposed thereon, respectively. While resist layer 110 is shown in FIG. 2B as being disposed upon each of reinforcement ribs 120A, 120B, 120C, 120D, and 120E, respectively, a resist layer 110 may be disposed upon a semiconductor wafer 10A and retained upon any resulting reinforcement structure according to the present invention, without limitation.

As noted above, resist layer 110 may comprise a polymer, a photopolymer, a metal, a silicon nitride hard mask formed from material of semiconductor wafer 10A, or another resist material, such as a conventional positive or negative photoresist suitable for the selected thinning technique, as known in the art. In addition, thickness $t_r$ of resist layer 110 may be selected not only for suitability in its function as a resist, but may also be selected for structurally reinforcing a semiconductor wafer. Generally, an increase in the thickness $t_r$ of the resist layer 110 may provide a corresponding increase in structural reinforcement to a semiconductor wafer of the present invention (e.g., semiconductor wafer 10A as shown in FIG. 1A). Further, mechanical properties of resist layer 110 (i.e., the material comprising resist layer 110) may be selected for reinforcing a semiconductor wafer of the present invention. More specifically, it may be advantageous to select, if a plurality of suitable resist materials is available for forming resist layer 110, a resist material having a relatively high modulus of elasticity in relation to the semiconductor wafer. For instance, a silicon semiconductor wafer may exhibit a modulus of elasticity of between about 110-210 GPa. Accordingly, a resist material having a modulus of elasticity exceeding the modulus of elasticity of a semiconductor wafer may be advantageous for providing support thereto.

Further, it may be advantageous to select, if a plurality of suitable resist materials is available for forming resist layer 110, a resist material having a relatively high tensile or compressive strength. Summarizing, the resist layer 110 may be structured (e.g., in thickness and configuration) and its mechanical characteristics (e.g., modulus of elasticity, tensile or compressive strength) preferentially selected for structurally reinforcing a semiconductor wafer according to the present invention. Additionally, the present invention encompasses a reinforcement structure configuration wherein at least one reinforcement element, such as an elongated rib structure, includes a resist layer formed thereon, while another at least one reinforcement element, such as an elongated rib structure, does not include a resist layer formed thereon. Further, the present invention encompasses a reinforcement structure configuration wherein at least one reinforcement element, such as an elongated rib structure, includes a resist layer of a first resist material formed thereon, while another at least one reinforcement element, such as an elongated rib structure, includes a resist layer of a second, different resist material formed thereon. In addition, the first and second reinforcement elements may comprise different reinforcement ribs or elements, which together define a single reinforcement rib on opposing sides of a semiconductor wafer.

In another aspect of the present invention, at least one reinforcement structure, such as a rib, may be formed into both sides of a semiconductor wafer of the present invention. Put another way, at least one reinforcement structure may protrude or extend from a first surface of a thinned region of a semiconductor wafer and at least one reinforcement structure may protrude or extend from a second, opposing surface of a thinned region of the semiconductor wafer. For example, turning to FIG. 2C, reinforcement ribs 220A, 220B, 220C, 220D, and 220E are shown in side cross-sectional views, respectively. Each of reinforcement ribs 220A, 220B, 220C, 220D, and 220E exhibits a portion extending in generally opposite directions from thinned region 30.

For instance, reinforcement rib 220A includes a first portion 222A extending from surface 32 of thinned region 30 and a second portion 224A extending from opposing surface 36 of thinned region 30. Similarly, reinforcement rib 220B includes a first portion 222B extending from surface 32 of thinned region 30 and a second portion 224B extending from opposing surface 36 of thinned region 30. Further, reinforcement rib 220C includes a first portion 222C extending from surface 32 of thinned region 30 and a second portion 224C extending from opposing surface 36 of thinned region 30. Also, reinforcement rib 220D includes a first portion 222D extending from surface 32 of thinned region 30 and a second portion 224D extending from opposing surface 36 of thinned region 30. Additionally, reinforcement rib 220E includes a first portion 222E extending from surface 32 of thinned region 30 and a second portion 224E extending from opposing surface 36 of thinned region 30.

To form reinforcement ribs 220A, 220B, 220C, 220D, or 220E, at least a portion of unthinned semiconductor wafer 12 (FIGS. 1B and 1C) may be removed from each of surfaces 14 and 16 (FIG. 1B) thereof. Thus, the aforementioned processes, such as etching, abrasive jet milling, or laser ablation, may be used to remove at least a portion of both of surfaces 14 and 16 of unthinned semiconductor wafer 12. In addition, it may be advantageous to remove the portions of both of surfaces 14 and 16 substantially simultaneously via substantially identical or, alternatively, different processes. Such a method of manufacture may reduce the time for forming any of reinforcement ribs 220A, 220B, 220C, 220D, or 220E. Alternatively, portions of surfaces 14 and 16 may be removed sequentially or separately (i.e., one at a time), if desired. As a further consideration, a plurality of semiconductor dice may be formed upon either of thinned surfaces (e.g., surfaces 32 or 36 of thinned region 30, as shown in FIG. 2C) at any time subsequent to formation thereof, respectively.

The present invention also contemplates that a resist layer may reside and be retained upon both ends of at least one reinforcement element or structure comprising a semiconductor wafer having reinforcement structures protruding from two surfaces thereof. As noted above, the respective resist layers may comprise different resist materials. For instance, as shown in FIG. 2E, a resist layer 110 may be formed and retained upon the end surface 27 of any of reinforcement ribs 221A, 221B, 221C, 221D, and 221E, respectively, for providing reinforcement to a semiconductor wafer of the present invention. In further detail, reinforcement rib 221A may include a first portion 232A extending from surface 32 of thinned region 30 and a second portion 234A extending from opposing surface 36 of thinned region 30. Similarly, reinforcement rib 221B may include a first portion 232B extending from surface 32 of thinned region 30 and a second portion 234B extending from opposing surface 36 of thinned region 30. Further, reinforcement rib 221C may include a first portion 232C extending from surface 32 of thinned region 30 and a second portion 234C extending from opposing surface 36 of thinned region 30. Also, reinforcement rib 221D may include a first portion 232D extending from surface 32 of thinned region 30 and a second portion 234D extending from opposing surface 36 of thinned region 30. Additionally, reinforcement rib 221E may include a first portion 232E extending from surface 32 of thinned region 30 and a second portion 234E extending from opposing surface 36 of thinned region 30. A resist layer 110 may reside upon any of first or second portions 232A, 232B, 232C, 232D, 232E, 234A, 234B, 234C, 234D, or 234E, without limitation.

Figure 2C:
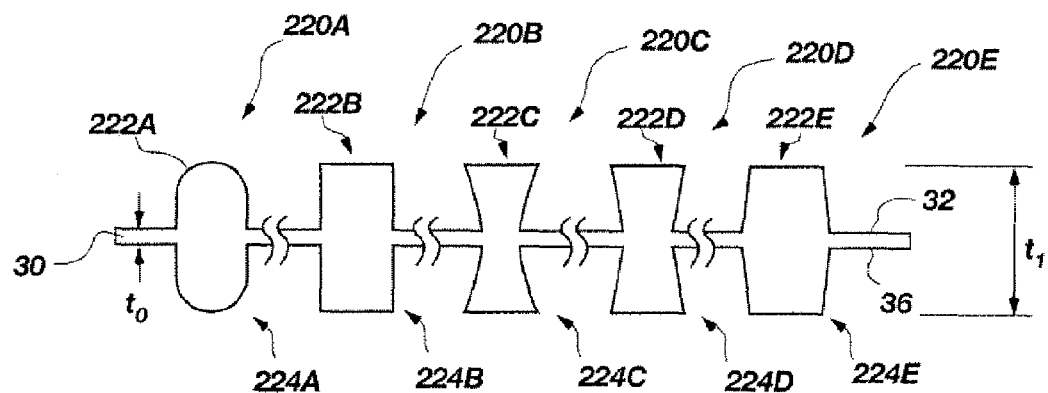
FIG. 2C shows a side cross-sectional view of further alternative embodiments of the reinforcement rib shown in FIG. 1A, taken along reference line A-A.
Figure 2E:
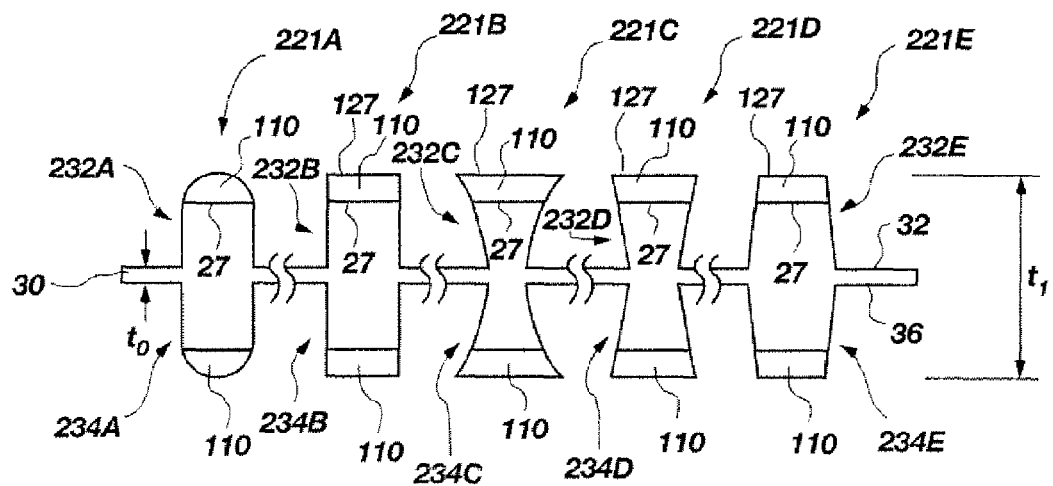
FIG. 2E shows a side cross-sectional view of alternative embodiments of the reinforcement rib as shown in FIG. 2C, including a resist layer thereon, respectively.
Figure 2D:
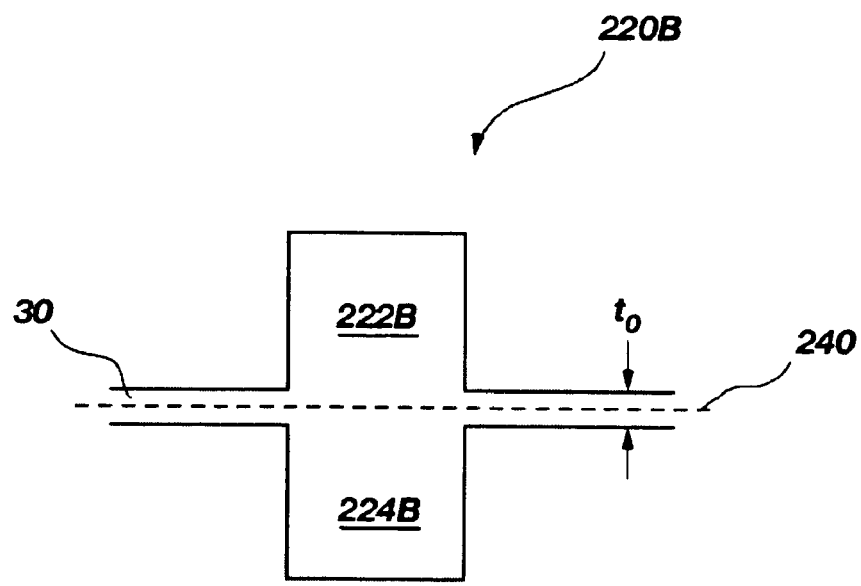
FIG. 2D shows an enlarged side cross-sectional view of an embodiment of a reinforcement rib shown in FIG. 2C, illustrating a neutral axis thereof.

As a further aspect of the present invention, a reinforcement structure that is formed into both surfaces of a semiconductor wafer (e.g., reinforcement ribs 220A, 220B, 220C, 220D, or 220E) may be substantially symmetric about an axis that is substantially vertically centered within the cross-sectional area of thinned region 30 (i.e., a surface positioned between surfaces 32 and 36 of thinned region 30), as shown in FIG. 2C. Such a configuration may be advantageous for reducing stresses within the thinned region. Specifically, referring now to FIG. 2D, reinforcement rib 220B (FIG. 2C) is shown in an enlarged cross-sectional view. As known in the art, bending stress at a given position within a material is related to a position of the material in relation to a neutral axis of a cross-sectional area of the material at the given position. Therefore, configuring the first portion 222B and the second portion 224B of reinforcement rib 220B so that neutral axis 240 of the cross-sectional area thereof lies within the thickness $t_0$ of the thinned region 30 or, alternatively, at least proximate thereto, may limit or reduce stresses that develop therein.

As a further consideration, in response to an applied moment, tension develops with respect to one side of the neutral axis and compression develops to the opposite side of the neutral axis. Therefore, it may be advantageous to structure the first portion 222B and the second portion 224B of the reinforcement rib 220B so as to position the neutral axis 240 in relation to the thinned region 30 to promote a desired stress state therein, in response to an anticipated bending moment. In this way, a preferable or desired stress state within the thinned region may be promoted and a less desirable or undesirable stress state may be inhibited. Put another way, given an expected or intended moment and a direction thereof, the position of the neutral axis of a reinforcement rib may be selected for promoting a selected stress state (e.g., tension or compression) to provide a more robust wafer structure.

However, it should also be noted that although each of reinforcement ribs 220A, 220B, 220C, 220D, and 220E, are depicted in FIG. 2C as being substantially symmetrical about thinned region 30 of a semiconductor wafer of the present invention, the present invention is not so limited. Rather, the first portions 222A, 222B, 222C, 222D, and 222E may be differently structured and positioned than the second portions 224A, 224B, 224C, 224D, and 224E of reinforcement ribs 220A, 220B, 220C, 220D, and 220E, respectively.

Figure 2F:
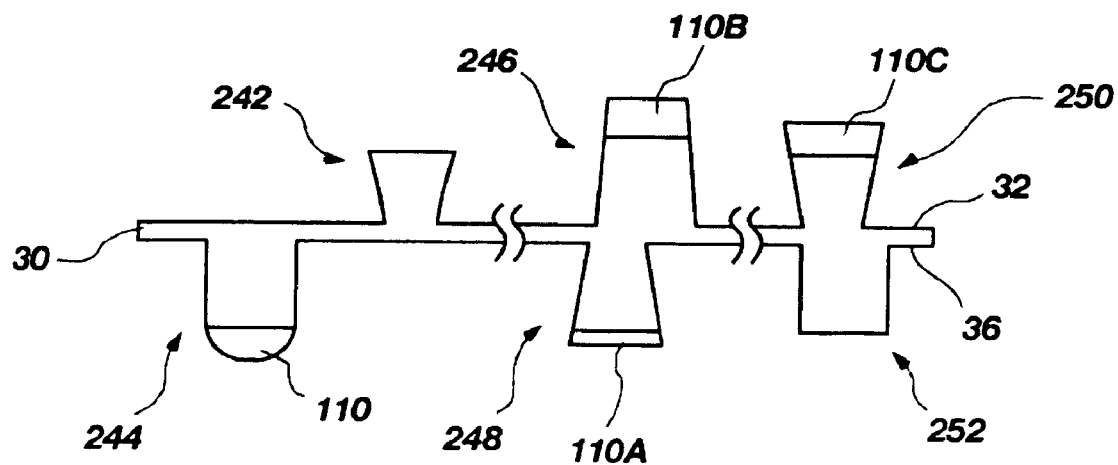
FIG. 2F shows a side cross-sectional view of alternative embodiments of reinforcement ribs according to the present invention.

For example, FIG. 2F shows a reinforcement rib 242 protruding from surface 32 of thinned region 30, which is laterally offset from reinforcement rib 244 protruding from surface 36. Further, reinforcement rib 244 includes a resist layer 110, while reinforcement rib 242 does not. Also, tapered reinforcement rib 246 protrudes from surface 32 of thinned region 30 and includes a relatively thick resist layer 110B. In contrast, tapered reinforcement rib 248, which is generally aligned with reinforcement rib 246, but protrudes from surface 36 of thinned region 30, comprises a relatively thin resist layer 110A. Further, tapered reinforcement rib 250 includes a resist layer 110C and is generally aligned with generally rectangular reinforcement rib 252, which does not include a resist layer. As shown in FIG. 2F, differently sized, shaped, positioned, and configured reinforcement ribs may protrude from a common surface or a generally opposing surface of a semiconductor wafer. Thus, it may be appreciated that many different reinforcement structures are contemplated by the present invention.

As further contemplation of the present invention, optionally, a reinforcing material may be deposited at least partially over at least one thinned region 30 of a semiconductor wafer 10 according to the present invention.

For example, FIGS. 3A-3D show side cross-sectional views of configurations including a reinforcement material 108 formed over at least a portion of surface 32 of thinned region 30, in relation to reinforcement ribs 120B (including resist layer 110). It should be understood that FIGS. 3A-3D are merely exemplary, and a reinforcement material 108 may be formed over at least a portion of a surface 32 of at least one thinned region 30 as in any embodiment (e.g., as described herein) encompassed by the present invention, without limitation. Accordingly, a reinforcement material 108 may be formed over more than one thinned region or thinned regions formed into both sides of a substrate, without limitation and without reference to any particular reinforcement rib embodiment or configuration.

Figure 3A:
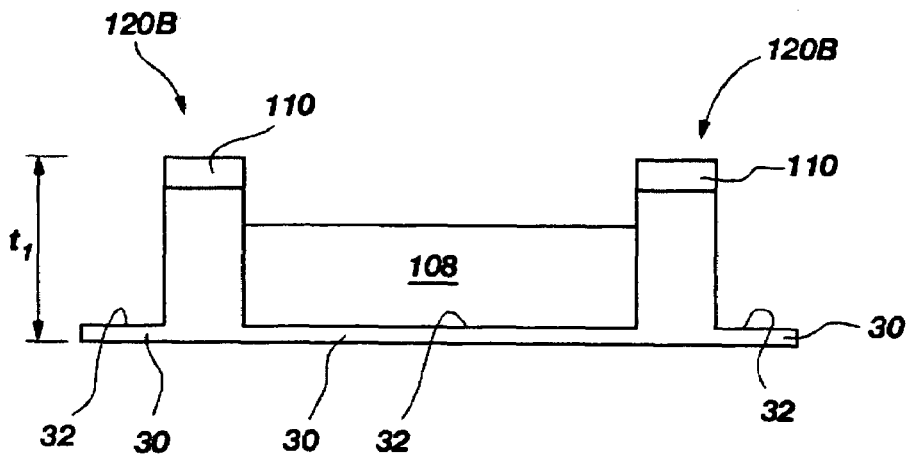
FIGS. 3A-3D each shows a side cross-sectional view of a different embodiment of a reinforcement rib arrangement including a reinforcement material deposited over at least a portion of a thinned region according to the present invention.
Figure 3B:
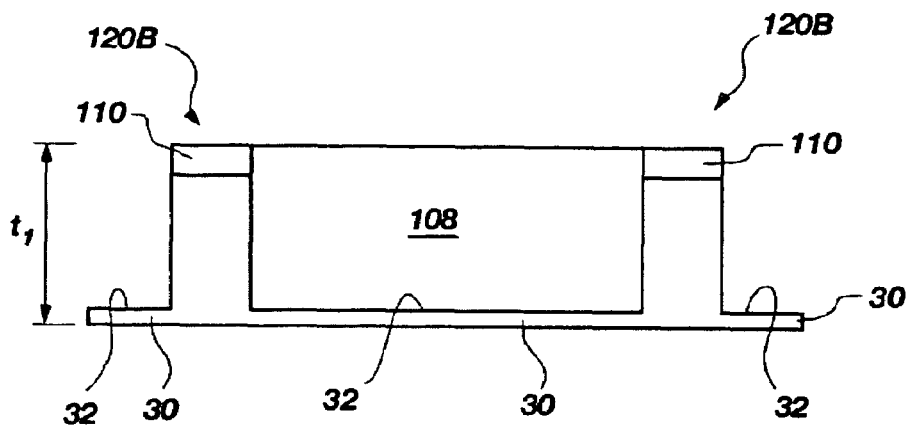
Figure 3C:
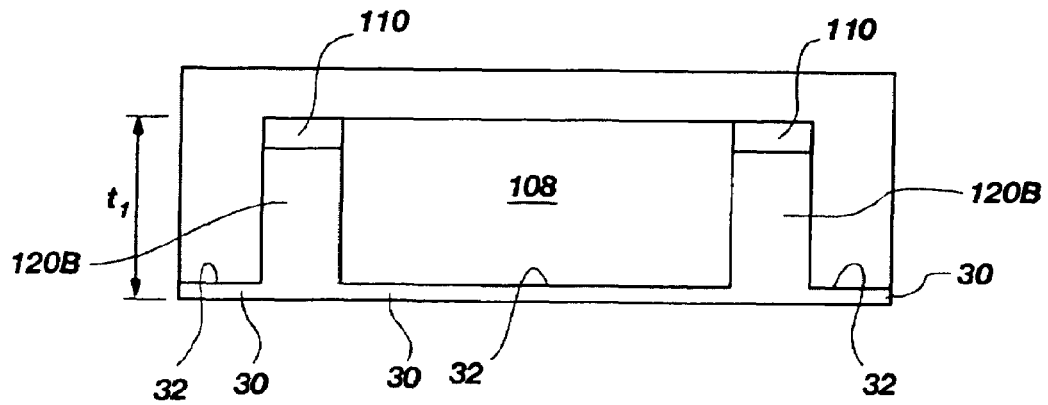
Figure 3D:
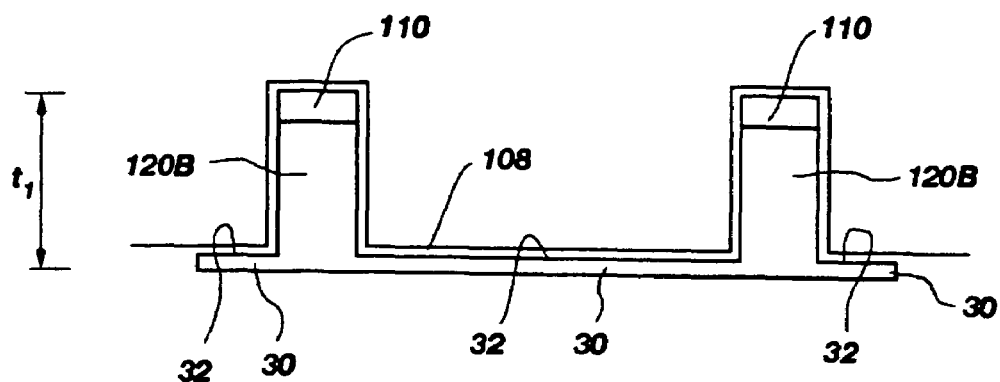

FIG. 3A shows a side cross-sectional view of a reinforcement material 108 formed over surface 32 of thinned region 30 and having a thickness of less than the thickness $t_1$ of reinforcement ribs 120B. Comparatively, FIG. 3A shows a side cross-sectional view of a reinforcement material 108 formed over surface 32 of thinned region 30 and having a thickness substantially equal to the thickness $t_1$ of reinforcement ribs 120B. Further, FIG. 3C shows a side cross-sectional view of a reinforcement material 108 formed over surfaces 32 of thinned region 30 and having a thickness exceeding the thickness $t_1$ of reinforcement ribs 120B. Also, FIG. 3D shows a side cross-sectional view of a reinforcement material 108 formed generally as a blanket coating or layer over surfaces 32 of thinned regions 30 and reinforcement ribs 120B.

Exemplary materials that may comprise reinforcement material 108 may include, for example, a metal, a polymer, an encapsulant, a photopolymer, an epoxy, a glass (e.g., borophosphosilicate glass, phosphosilicate glass, borosilicate glass), a thermoplastic, and a thermoset plastic. Reinforcement material 108 may be applied, deposited, or formed at least partially over a surface 32 of thinned region 30 by, for example, spin coating, spraying, doctor blade coating, film transfer techniques, screen-printing techniques, dispensing techniques, dipping, spin-on-glass (SOG) techniques, physical vapor deposition (PVD), atomic layer deposition (ALD), chemical vapor deposition (CVD), low pressure chemical vapor deposition (LPCVD), plating, electroplating, or any other deposition techniques as known in the art.

For example, it may be desirable that reinforcement material 108 comprise a photopolymer which may be formed at least partially over surface 32 of thinned region 30 (and reinforcement ribs, if desired) by spin-coating and curing, en masse, the reinforcement material 108 in response to exposure to a UV light or heat. Put another way, curing of reinforcement material 108 may be effected substantially en masse or substantially as a whole subsequent to deposition thereof by broad-source UV light in a chamber, thermal cure in an oven, or combinations thereof. In this manner, reinforcement material 108 may be formed in a minimal amount of time.

In another aspect of the present invention, a plurality of reinforcement structures, such as reinforcement ribs, may be formed for supporting or reinforcing a semiconductor wafer by selective thinning of at least one region thereof. Further, the reinforcement structure of a semiconductor wafer according to the present invention may exhibit a variety of shapes and designs, so long as the reinforcement structure is suitable for the purposes of the present invention.

Figure 4A:
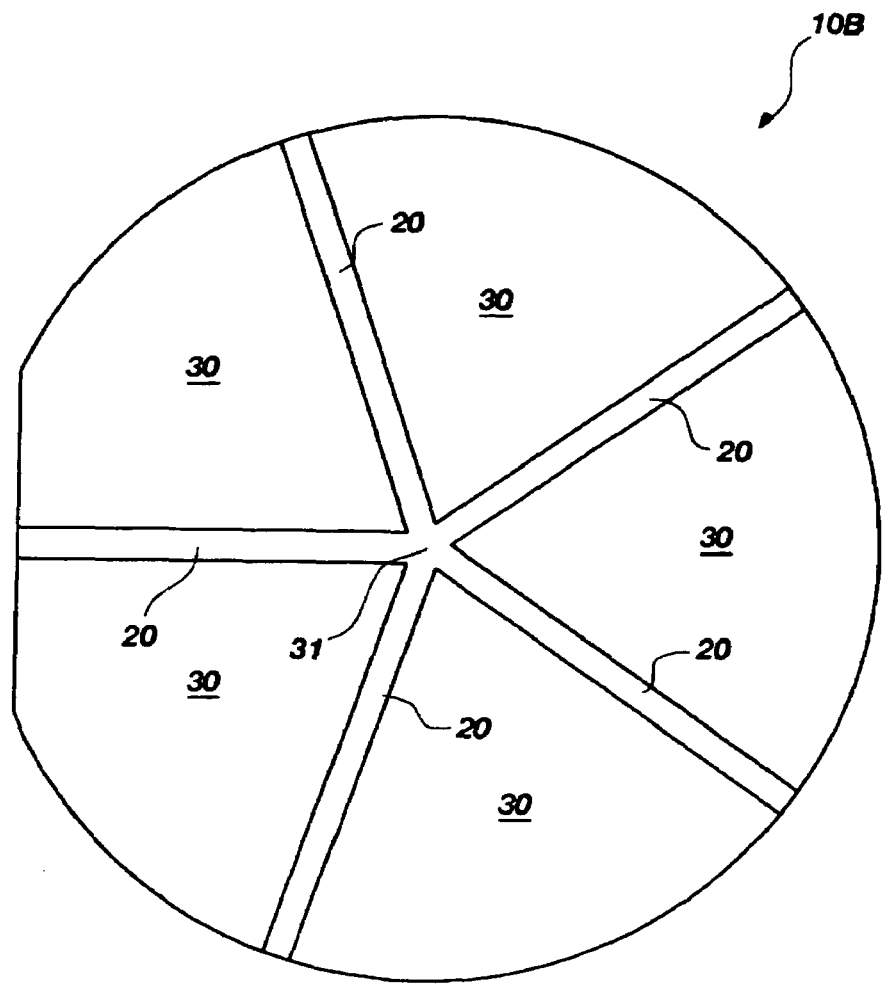
FIG. 4A shows a top elevation view of a semiconductor wafer according to the present invention having an odd plurality of radially extending reinforcement ribs.
Figure 4B:
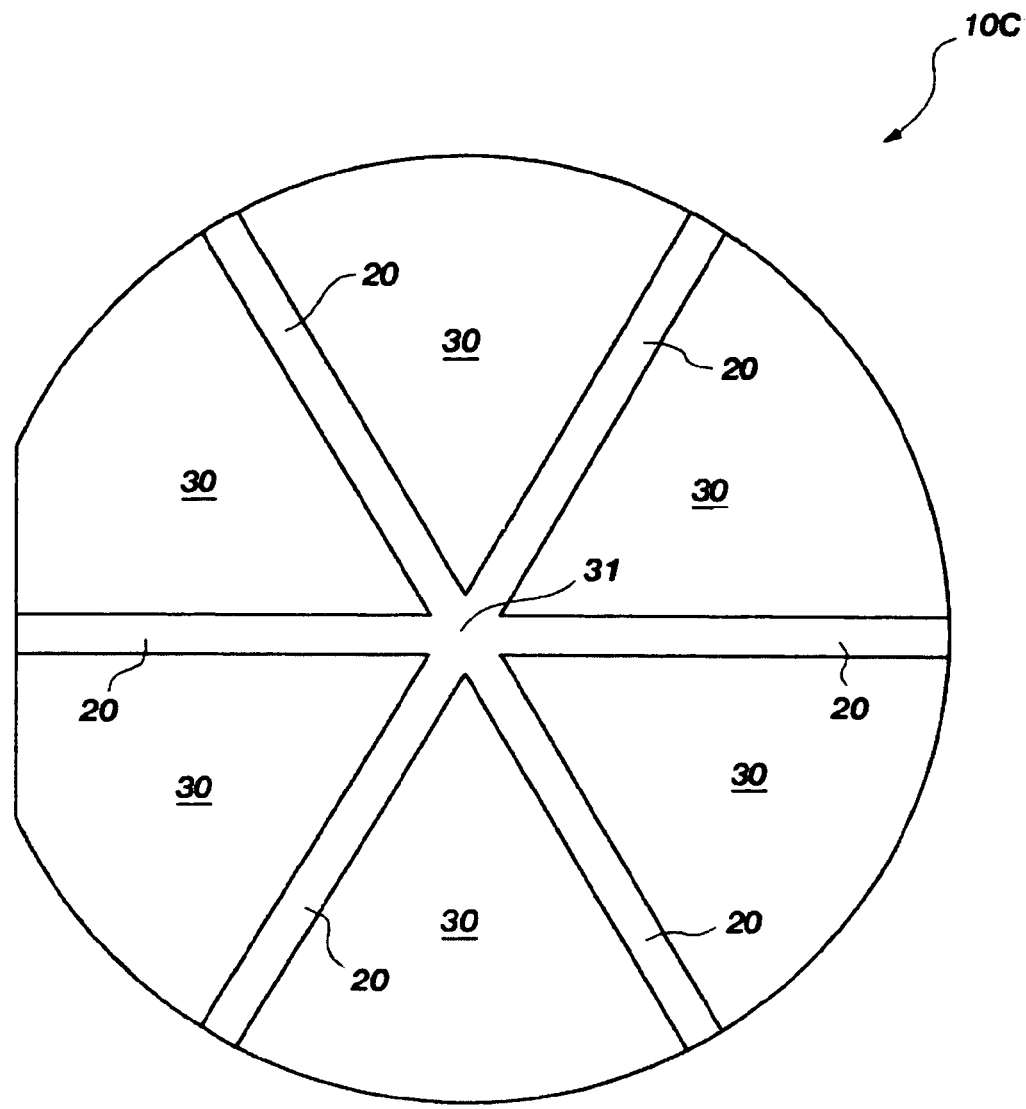
FIG. 4B shows a top elevation view of a semiconductor wafer according to the present invention having an even plurality of radially extending reinforcement ribs.

For example, the reinforcement structure of semiconductor wafers 10B and 10C of the present invention are shown in FIGS. 4A and 4B, respectively, in top elevation views. Semiconductor wafers 10B and 10C each include a pattern (i.e., a plurality) of radially extending reinforcement ribs 20 that intersect at a common, substantially central intersection region 31, separate a plurality of generally pie-slice shaped wedges (i.e., generally, a sector of a circular body), and define thinned regions 30 as shown in FIGS. 4A and 4B. FIGS. 4A and 4B depict an odd number of reinforcement ribs 20 and an even number of reinforcement ribs 20, respectively.

Figure 4C:
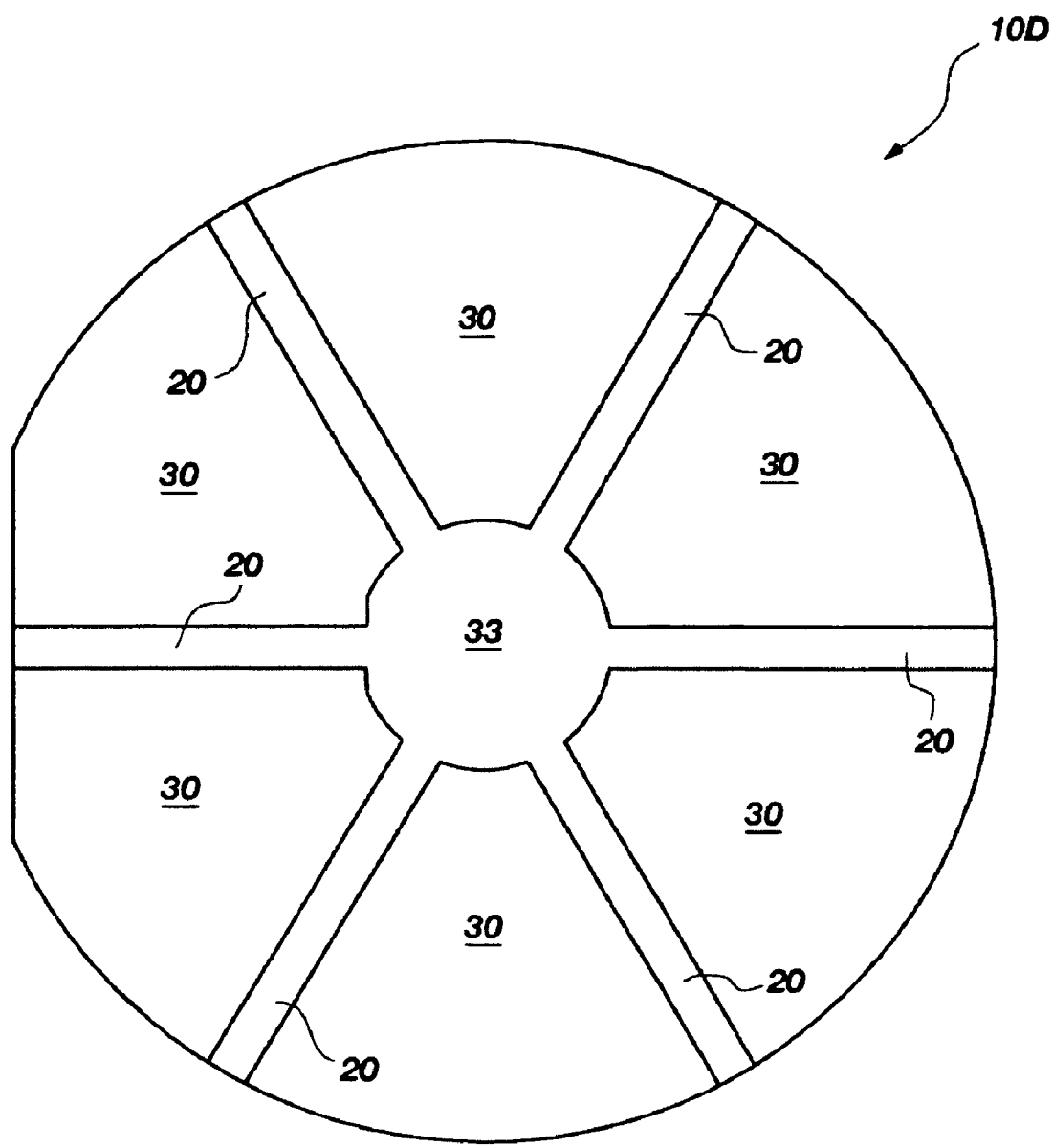
FIG. 4C shows a top elevation view of a semiconductor wafer according to the present invention having a plurality of radially extending reinforcement ribs, each reinforcement rib extending from a common, enlarged central region.

In another embodiment of a semiconductor wafer of the present invention, FIG. 4C shows a reinforcement structure of the semiconductor wafer 1OD including a pattern of radially extending reinforcement ribs 20 extending from a central region 33. Thus, a plurality of thinned regions 30, each exhibiting a generally pie-slice shaped wedge geometry (i.e., a sector of a circular body) may be formed, as shown in FIG. 4C. Furthermore, central region 33 may be structured as an enlarged pad for facilitating handling of the semiconductor wafer 1OD. For instance, central region 33 may be sized and configured for automated handling via a vacuum apparatus (e.g., a vacuum wand or the like). Alternatively, central region 33, reinforcement ribs 20, or both may be sized and configured for manipulation or handling by way of another automated handling device as known in the art.

Accordingly, the present invention contemplates that at least one elongated reinforcement structure (e.g., reinforcement rib 20), may be employed for reinforcing a semiconductor wafer and at least one non-elongated reinforcement structure (e.g., central region 33) may be employed for reinforcing a semiconductor wafer, in combination or separately, without limitation.

Figure 5A:
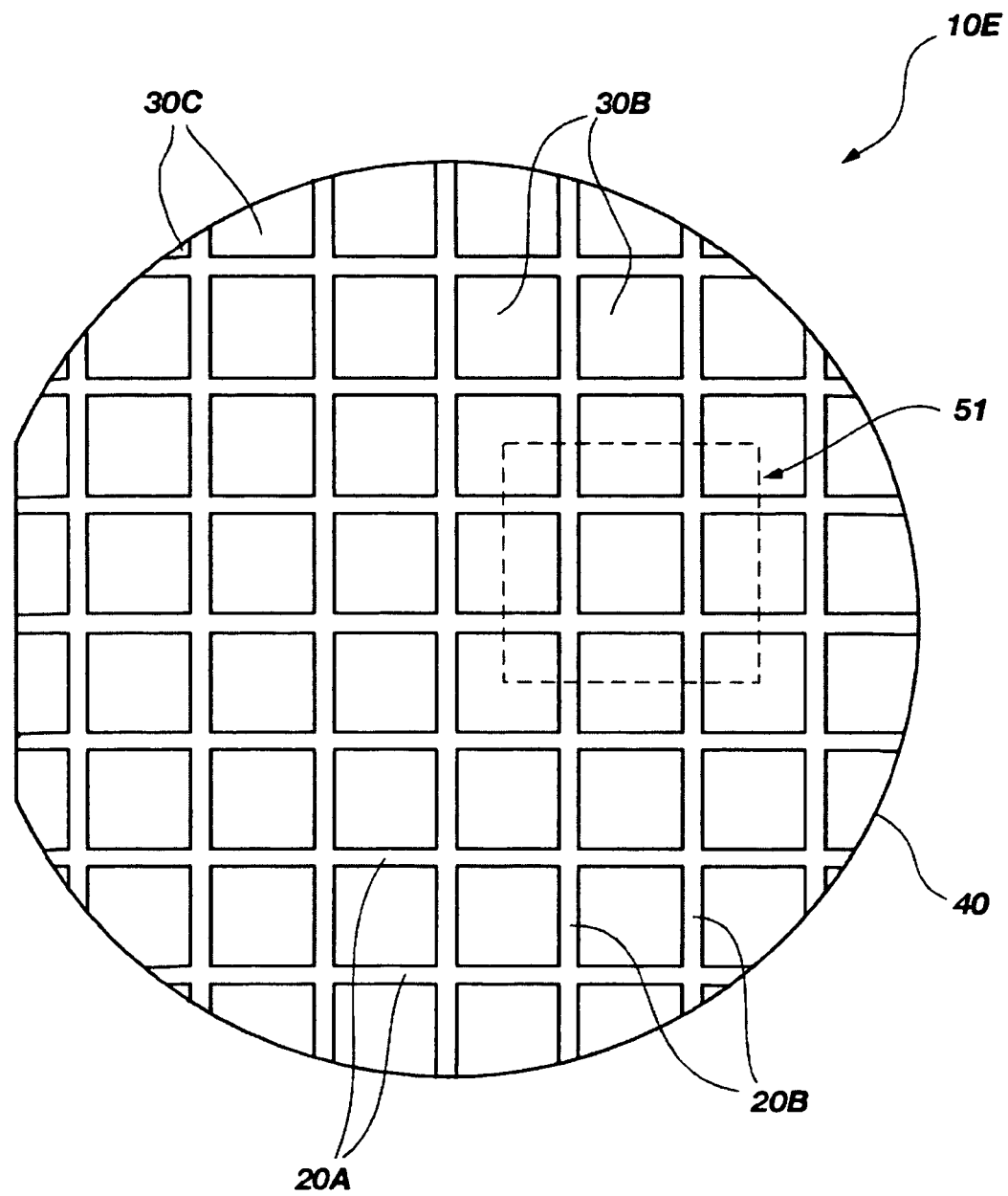
FIG. 5A is a top elevation view of another embodiment of a semiconductor wafer of the present invention including a first plurality of substantially mutually parallel reinforcement ribs, which at least partially intersect with a second plurality of substantially mutually parallel reinforcement ribs.

In a further embodiment of the present invention, semiconductor wafer 10E is shown in FIG. 5A in a top elevation view and includes a reinforcement structure according to the present invention having a first plurality of substantially mutually parallel reinforcement ribs 20A, which at least partially intersect with a second plurality of substantially mutually parallel reinforcement ribs 20B. As shown in FIG. 5A, the first plurality of substantially mutually parallel reinforcement ribs 20A may be substantially perpendicular to the second plurality of substantially mutually parallel reinforcement ribs 20B. In such a configuration, the at least partial intersection of the first substantially mutually parallel reinforcement ribs 20A with the second plurality of substantially mutually parallel reinforcement ribs 20B may define or separate thinned regions 30B. In such a configuration, thinned regions 30B may comprise a plurality of parallelograms, such as rectangles and, specifically, a plurality of squares, as shown in FIG. 5A. In addition, partially rectangular thinned regions 30C may be formed, depending on the shape of the outer periphery 40 of semiconductor wafer 10E in relationship to the size, spacing, orientation, and position of the first mutually parallel reinforcement ribs 20A and the second plurality of mutually parallel reinforcement ribs 20B.

The present invention further contemplates that the fabrication of semiconductor dice superimposed in relationship to the thinned regions. For instance, it may be advantageous to form semiconductor dice upon the semiconductor wafer prior to thinning thereof (i.e., upon the opposing surface in relation to the surface to be thinned). Such a configuration may reduce the likelihood of damaging the semiconductor dice during the thinning process.

Figure 5B:
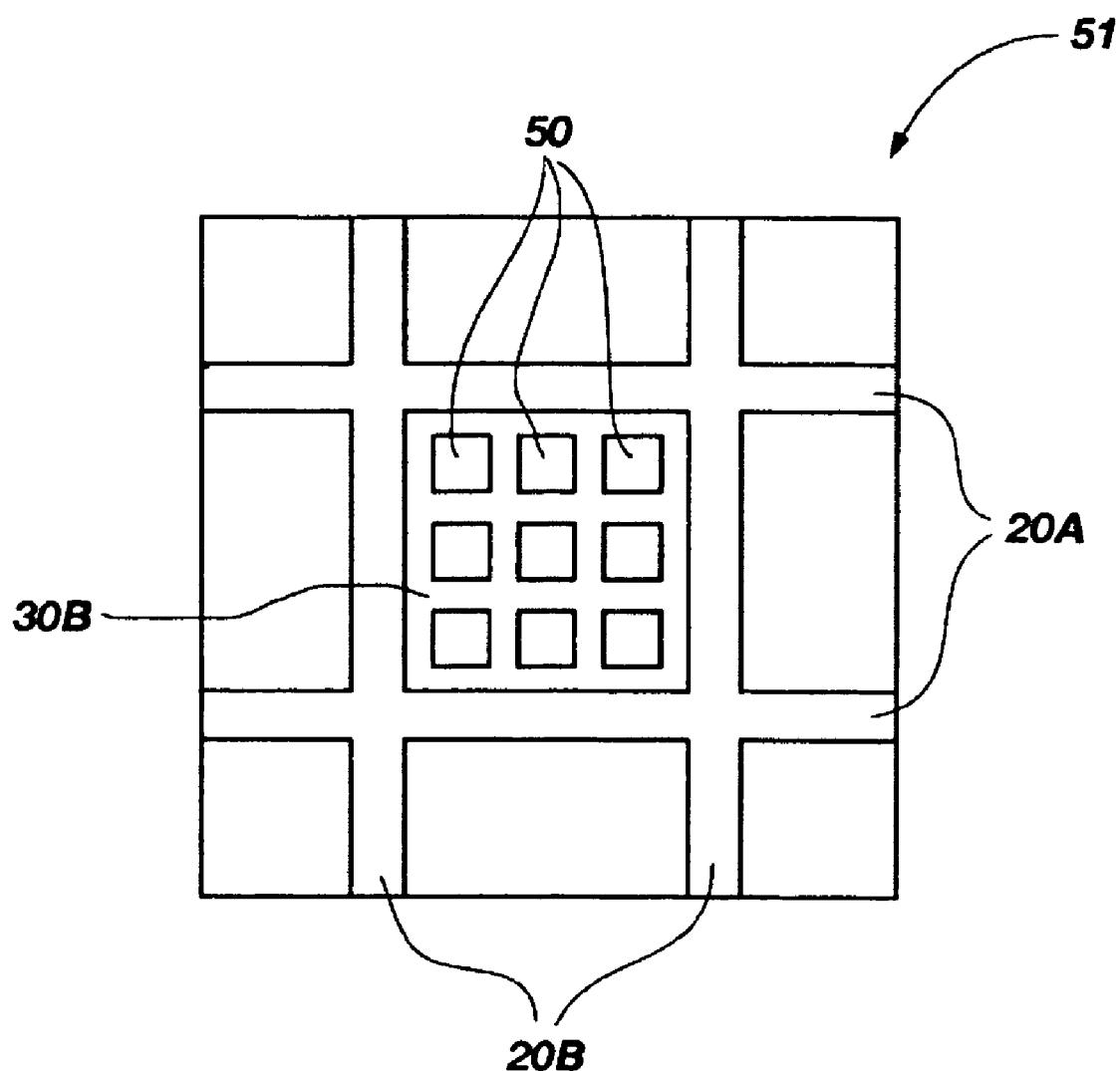
FIG. 5B is an enlarged partial top elevation view of the semiconductor wafer shown in FIG. 5A.

In one example, as shown in FIG. 5B, showing an enlarged top elevation view of region 51 of semiconductor wafer 10E (FIG. 5A), the size and shape of thinned regions 30B may be selected for accommodating at least one semiconductor die fabricated in superimposition therewith. Optionally, the size and shape of thinned regions 30B may be selected for optimizing a number of semiconductor dice to be fabricated in superimposition therewith, taking into account the intended dimensions of the semiconductor dice, the street width therebetween, and required lateral clearance between die locations and adjacent reinforcement structures.

Particularly, a plurality (e.g., nine, as shown in FIG. 5B) of semiconductor dice 50 may be positioned in a superimposed relationship within each of thinned regions 30B. In such a configuration, it may be appreciated that a dicing operation may be used to separate thinned regions 30A and 30B from the reinforcement ribs 20A and 20B, and may further separate or singulate each of the plurality of semiconductor dice 50 of any of thinned regions 30A and 30B. Alternatively, a single semiconductor die (not shown) may be positioned within each thinned region 30B. In such a configuration, reinforcement ribs 20A and 20B may be sized and positioned along desired dicing paths, so that dicing substantially removes reinforcement ribs 20 from the semiconductor wafer 10E, leaving thinned regions 30B, each having a single semiconductor die (not shown) therein.

However, as shown in FIG. 5B, each of the plurality of semiconductor dice 50 is sized and positioned so as to be substantially superimposed within an associated thinned region 30B. Put another way, each individual, separated semiconductor die 50 of the plurality of semiconductor dice may be sized and positioned so that, upon removal of the reinforcement ribs 20A and 20B, each of the semiconductor dice 50 remains. That is, none of the material layers forming the circuitry of each of the plurality of semiconductor dice 50 is superimposed with the at least one reinforcement rib 20A and 20B.

By extension, a plurality of semiconductor dice formed upon a surface of a semiconductor wafer according to the present invention (e.g., semiconductor wafer 10A, 10B, 10C, 10D, 10E, 10F, 10G, or 10H) may be preferably sized and positioned in avoidance of superimposition with the reinforcement structure thereof.

Accordingly, semiconductor dice may be formed upon a surface (e.g., second surface 16 as shown in FIG. 2A) prior to thinning at least one region to form a reinforcement structure which extends from a surface of a thinned region (e.g., surface 32 of thinned region 30 as shown in FIG. 2A) of a semiconductor wafer of the present invention (e.g., semiconductor wafer 10B as shown in FIG. 4A). Alternatively, semiconductor dice may be formed upon a thinned surface (e.g., surface 32 of thinned region 30 as shown in FIG. 2A), after thinning, of a semiconductor wafer of the present invention. Considering an embodiment where both surfaces of a semiconductor wafer are thinned (FIG. 2C), it may be advantageous to thin the semiconductor wafer from one surface and form semiconductor dice thereon and then thin the semiconductor wafer from the second surface.

Figure 6A:
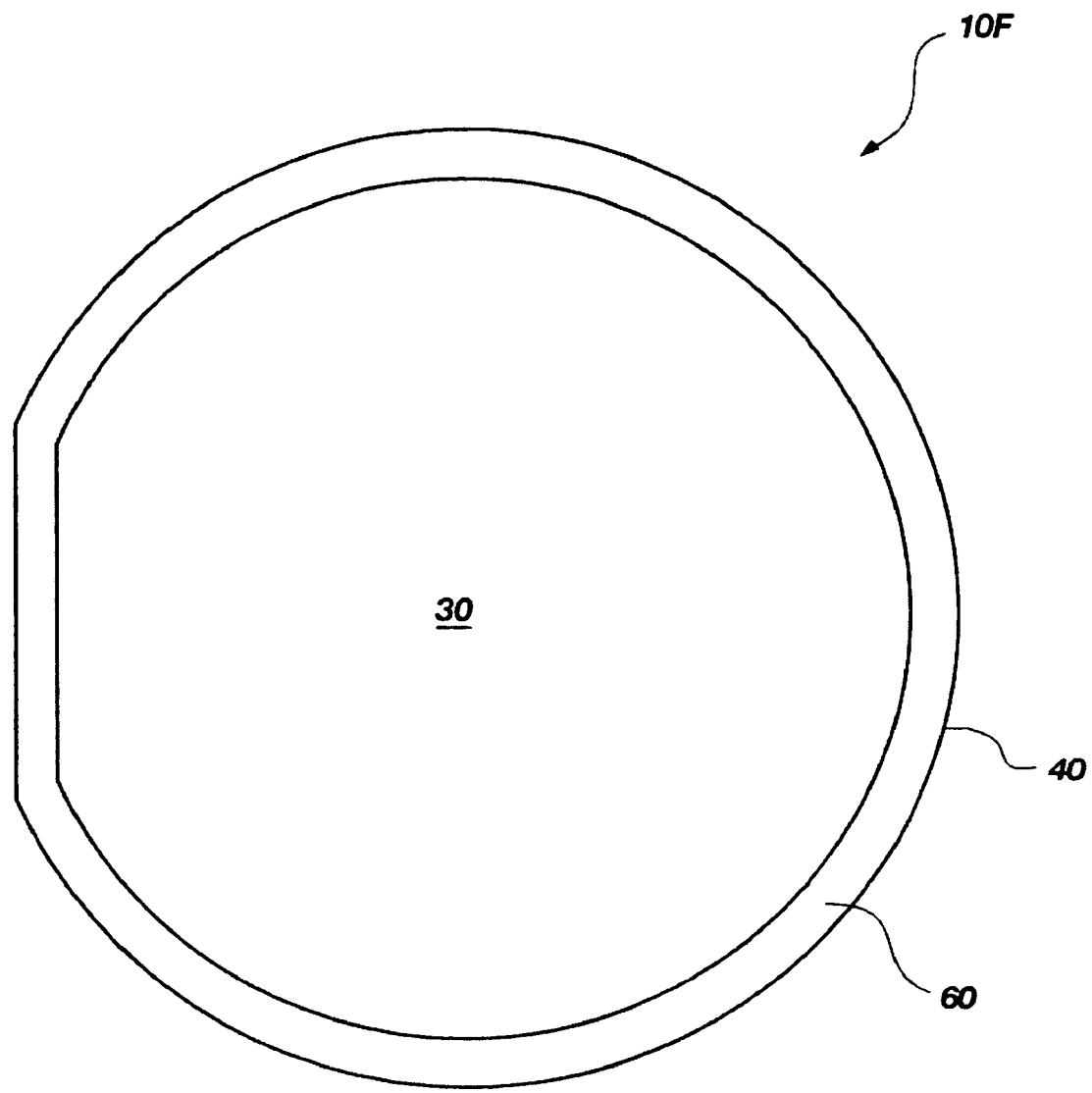
FIG. 6A is a top elevation view of a further embodiment of a semiconductor wafer of the present invention including a peripheral reinforcement rib.

In yet a further aspect of the present invention, a peripheral rib 60 or frame of the material of a semiconductor wafer 10F may be formed about the periphery thereof, as shown in FIG. 6A, which depicts a top elevation view of semiconductor wafer 10F. Such a configuration may be preferable for use with automated handling equipment designed for contacting a periphery 40 of the semiconductor wafer 10F.

Figure 6B:
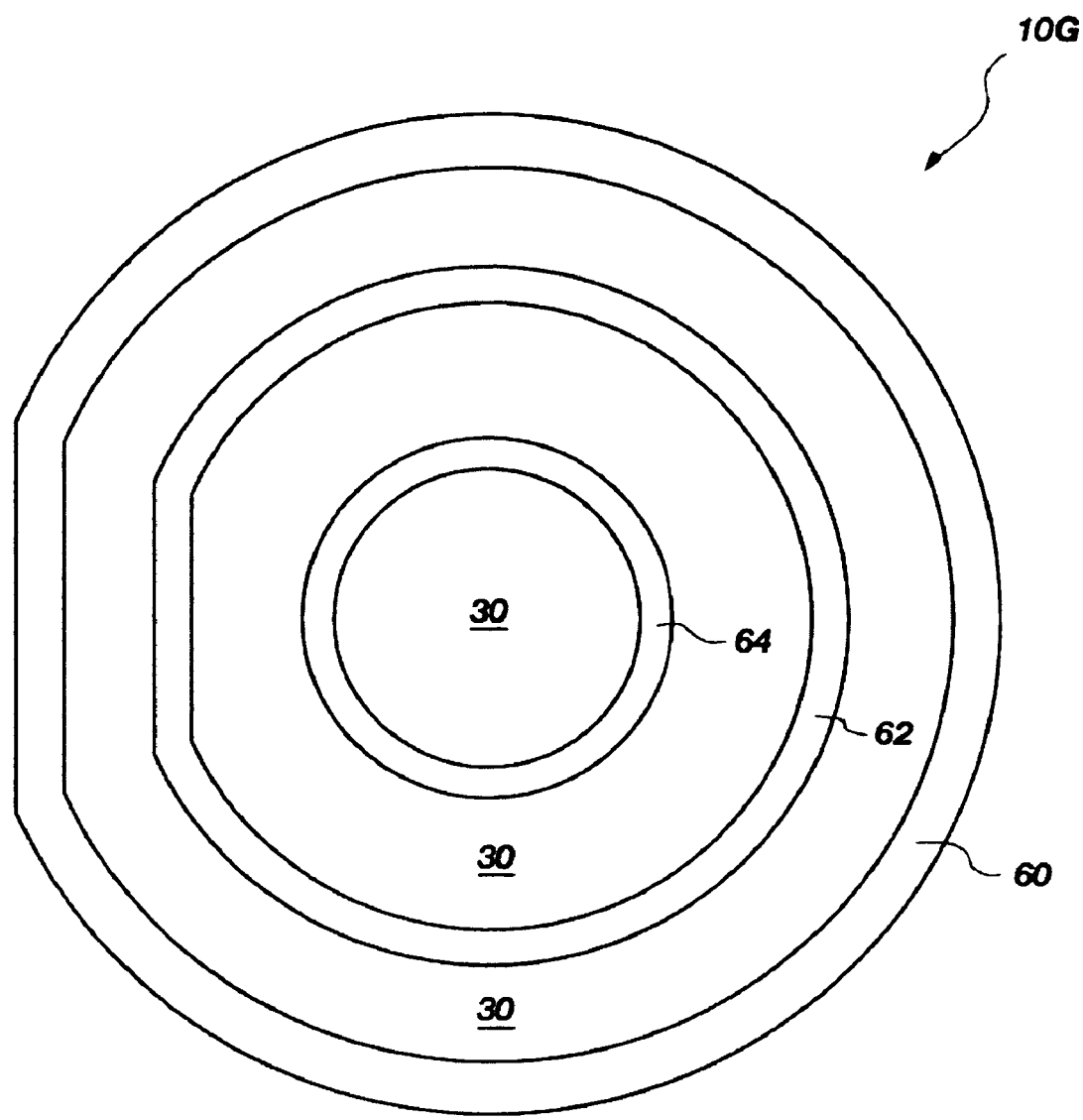
FIG. 6B is a top elevation view of yet another embodiment of a semiconductor wafer of the present invention including a peripheral reinforcement rib, another reinforcement rib forming a closed plane figure therein, and an additional reinforcement rib forming a closed plane figure within the another reinforcement rib.

Additionally, as shown in FIG. 6B, which shows a top elevation view of semiconductor wafer 10G, inner, substantially annular rib features 62 and 64 may be positioned within a peripheral rib 60 and may generally form a closed plane figure (e.g., a circle, a square, a triangle, a polygon, etc.).

Figure 7:
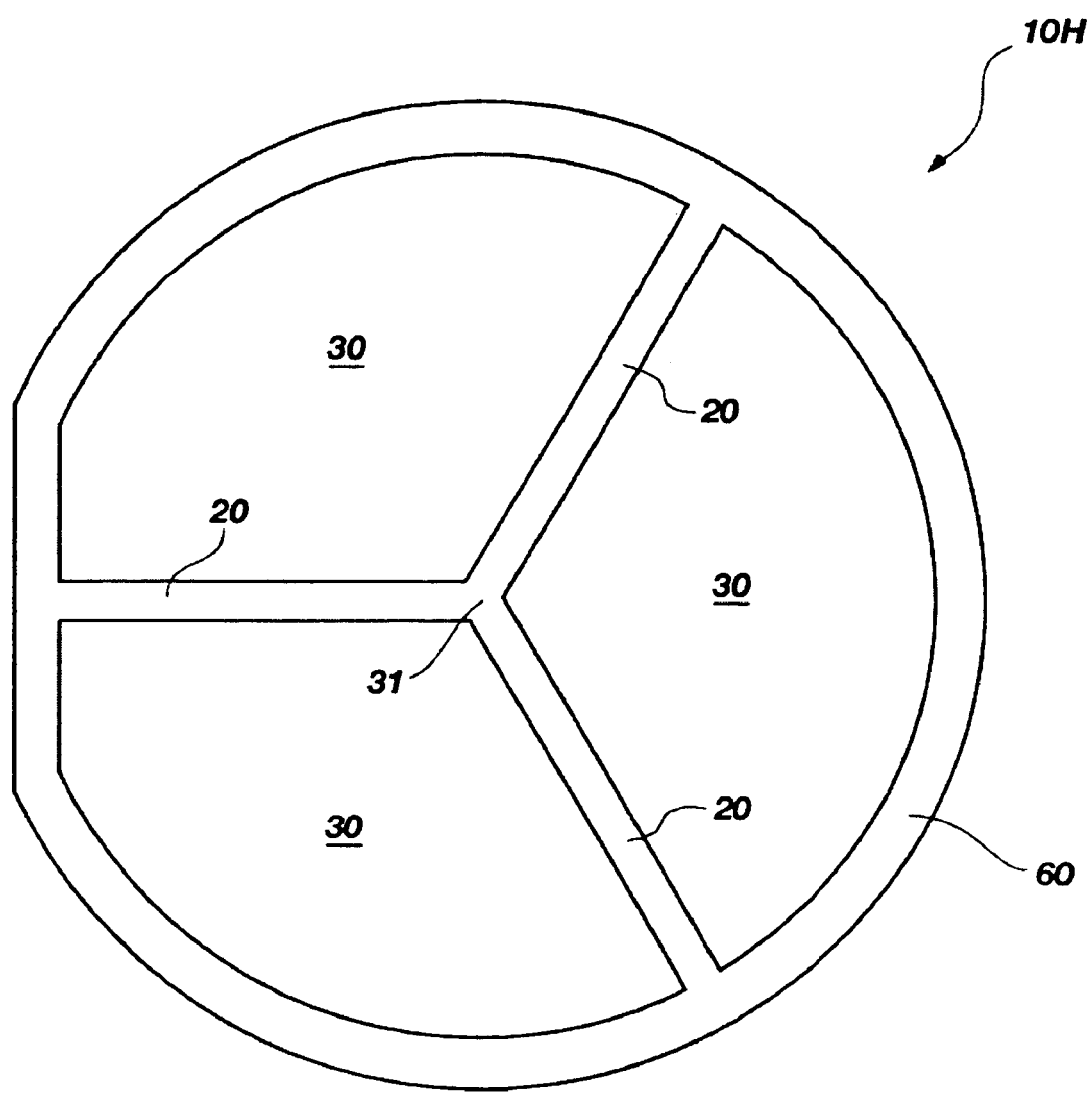
FIG. 7 is a top elevation view of yet a further embodiment of a semiconductor wafer of the present invention including a plurality of radially extending reinforcement ribs and a peripheral reinforcement rib.

Of course, as may be appreciated, combinations or modifications of the above-described embodiments are also encompassed by the present invention. For instance, FIG. 7 shows a top elevation view of a semiconductor wafer 10H including a reinforcement structure comprising three generally radially extending reinforcement ribs 20 and a peripheral rib 60. Radially extending reinforcement ribs 20 may extend radially outwardly from an intersection region 31 to peripheral rib 60. Thus, peripheral rib 60 in combination with reinforcement ribs 20 may form a reinforcement structure of the present invention. It is further contemplated that additional, substantially annular rib features (see FIG. 6B) may be formed within peripheral rib 60 and intersect radially extending reinforcement ribs 20.

As discussed hereinabove, each of a plurality of reinforcement ribs 20 and peripheral rib 60 may comprise a substantially identical size, shape, and configuration or one or more of reinforcement ribs 20, inner rib features 62 and 64, and peripheral rib 60 may comprise different sizes, shapes and configuration, without limitation. Optionally, each of reinforcement ribs 20, inner rib features 62 and 64, and peripheral rib 60 may exhibit a different cross-sectional size, shape, and configuration.

Of course, a plurality of semiconductor devices or dice (not shown except in FIG. 5B), may be superimposed with each of the thinned regions 30 of any of semiconductor wafers 10A-10H, as known in the art. Prior to thinning of regions 30, 30A, or 30B as described hereinabove, a plurality of semiconductor dice may be formed upon a given semiconductor wafer of the present invention. In addition, such a semiconductor wafer, including a plurality of semiconductor dice, may be singulated to form a plurality of individual semiconductor dice, as known in the art. While, of course, it would be difficult if not impossible to fabricate semiconductor dice on thinned, as well as unthinned, regions of a semiconductor wafer if the wafer is thinned from both sides to form reinforcement structures, such as ribs, or if a wafer is to be thinned from only one side thereof, semiconductor dice may be fabricated over substantially all of the opposing side. Prior to singulation of the semiconductor dice, the reinforcement structure may then be removed, such as by back grinding.

It should also be noted that the present invention also encompasses a method of designing a semiconductor wafer having a reinforcement structure. Particularly, according to the present invention, at least one region of the semiconductor wafer may be selected for thinning, wherein such thinning forms at least one reinforcement structure as a remaining portion of the semiconductor wafer. Further, the size, shape and configuration of the at least one reinforcement structure and portions thereof may be selected in relationship to an anticipated moment or force applied to the semiconductor wafer. For instance, finite element analysis or other modeling or stress or strain analysis may be performed in relation to the at least one reinforcement structure and semiconductor wafer, taking into consideration the semiconductor material and crystallographic planes thereof, where applicable, as well as the effects of leaving resist materials on surfaces of reinforcement structures after formation thereof. Such a method may generate yet more suitable reinforcement structures in addition to the embodiments disclosed herein. Thus, not only a physically more robust structure to accommodate physical forces on the semiconductor wafer may be fabricated, but also a reinforcement structure exhibiting a beneficial stress state.

While the present invention has been disclosed in terms of certain preferred embodiments, those of ordinary skill in the art will recognize and appreciate that the invention is not so limited. Additions, deletions and modifications to the disclosed embodiments may be effected without departing from the scope of the invention as claimed herein. Similarly, features from one embodiment may be combined with those of another while remaining within the scope of the invention.

What is claimed is:

1. A method of forming a semiconductor device, comprising:
   thinning at least one region of a semiconductor wafer, the thinning comprising:
     removing material from a first side of the semiconductor wafer laterally within the at least one region thereof; and
     defining at least one reinforcement structure on the first side of the semiconductor wafer; and
   forming a plurality of semiconductor dice on or in at least one of the first side and a second side of the semiconductor wafer laterally within the at least one region of the semiconductor wafer.

2. The method of claim 1, wherein defining the at least one reinforcement structure comprises defining a plurality of reinforcement structures.

3. The method of claim 1, further comprising depositing at least one of a metal, a polymer, an encapsulant, a photopolymer, an epoxy, a glass, a thermoplastic, and a thermoset plastic at least partially over a surface of the at least one region of the semiconductor wafer.

4. The method of claim 1, wherein thinning at least one region of the semiconductor wafer further comprises:
   removing material from the second side of the semiconductor wafer within the at least one region; and
   defining at least one reinforcement structure on the second side of the semiconductor wafer.

5. The method of claim 4, wherein defining at least one reinforcement structure on the second side of the semiconductor wafer comprises defining at least one reinforcement structure on the second side of the semiconductor wafer that is substantially aligned with the at least one reinforcement structure on the first side of the semiconductor wafer.

6. The method of claim 5, wherein defining at least one reinforcement structure on the second side of the semiconductor wafer further comprises defining at least one reinforcement structure on the second side of the semiconductor wafer that is substantially symmetric with the at least one reinforcement structure on the first side of the semiconductor wafer about a plane extending through the at least one region of the semiconductor wafer.

7. The method of claim 1, wherein defining the at least one reinforcement structure comprises forming a peripheral reinforcement rib along a periphery of the semiconductor wafer.

8. The method of claim 7, further comprising:
   forming a plurality of additional reinforcement ribs in addition to the peripheral reinforcement rib;
   wherein each of the plurality of additional reinforcement ribs extends generally radially outwardly from at least one of a common, enlarged central region and a common intersection region.

9. The method of claim 8, further comprising:
forming each of the plurality of reinforcement ribs to extend generally radially outwardly from a common, enlarged central region; and
structuring the common, enlarged central region for facilitating handling of the semiconductor wafer via a vacuum apparatus.

10. The method of claim 1, wherein:
thinning at least one region of the semiconductor wafer comprises thinning a plurality of regions of the semiconductor wafer; and
wherein forming the plurality of semiconductor dice on or in at least one of the first side and the second side of the semiconductor wafer laterally within the at least one region of the semiconductor wafer comprises forming a plurality of semiconductor dice within each of at least some of the plurality of regions.

11. A semiconductor wafer comprising:
at least one reinforcement structure extending laterally along the semiconductor wafer and projecting from at least one of a first side and a second side of the semiconductor wafer; and
a plurality of at least partially formed semiconductor dice on or in at least one of the first side and the second side of the semiconductor wafer laterally within at least one region of the semiconductor wafer, the at least one region of the semiconductor wafer having a thickness that is less than a thickness of the at least one reinforcement structure.

12. The semiconductor wafer of claim 11, wherein the at least one reinforcement structure comprises a plurality of reinforcement ribs each projecting from both the first side and the second side of the semiconductor wafer.

13. The semiconductor wafer of claim 12, wherein the at least one region of the semiconductor wafer comprises a plurality of substantially rectangular regions defined between a first plurality of substantially mutually parallel reinforcement ribs and a second plurality of substantially mutually parallel reinforcement ribs that are oriented generally perpendicular to the first plurality of substantially mutually parallel reinforcement ribs.

14. The semiconductor wafer of claim 11, further comprising at least one of a metal, a polymer, an encapsulant, a photopolymer, an epoxy, a glass, a thermoplastic, and a thermoset plastic formed at least partially over a surface of the at least one region of the semiconductor wafer.

15. The semiconductor wafer of claim 11, wherein the at least one reinforcement structure includes a first portion projecting from the first side of the semiconductor wafer and a second portion projecting from the second side of the semiconductor wafer, the first portion and the second portion being substantially symmetric about a plane extending through the at least one region of the semiconductor wafer.

16. The semiconductor wafer of claim 11, wherein the at least one reinforcement structure comprises a peripheral reinforcement rib along at least a portion of a periphery of the semiconductor wafer.

17. The semiconductor wafer of claim 16, further comprising:
a plurality of additional reinforcement ribs in addition to the peripheral reinforcement rib;
wherein each of the plurality of additional reinforcement ribs extends generally radially outwardly from at least one of a common, enlarged central region and a common intersection region.

18. A semiconductor wafer comprising:
a plurality of reinforcement structures each extending laterally along the semiconductor wafer and projecting from at least one of a first side and a second side of the semiconductor wafer; and
a plurality of at least partially formed semiconductor dice on or in at least one of a first side and a second side of the semiconductor wafer laterally within each of a plurality of thin regions of the semiconductor wafer defined between the plurality of reinforcement structures, the thin regions of the semiconductor wafer having an average thickness that is less than an average thickness of the reinforcement structures of the plurality of reinforcement structures.

19. The semiconductor wafer of claim 18, wherein the plurality of reinforcement structures comprises a plurality of reinforcement ribs each extending laterally along the semiconductor wafer and projecting from both a first side and a second side of the semiconductor wafer.

20. The semiconductor wafer of claim 18, wherein the plurality of reinforcement structures comprises a first plurality of substantially mutually parallel reinforcement structures and a second plurality of substantially mutually parallel reinforcement structures that are oriented generally perpendicular to the first plurality of substantially mutually parallel reinforcement structures, and wherein the plurality of thin regions of the semiconductor wafer comprises a plurality of substantially rectangular regions defined between the first plurality of substantially mutually parallel reinforcement structures and the second plurality of substantially mutually parallel reinforcement structures.

* * * * *

UNITED STATES PATENT AND TRADEMARK OFFICE
CERTIFICATE OF CORRECTION

PATENT NO. : 7,332,413 B2 Page 1 of 1
APPLICATION NO. : 11/516095
DATED : February 19, 2008
INVENTOR(S) : Kirby It is certified that error appears in the above-identified patent and that said Letters Patent is hereby corrected as shown below:

On the Title page, in field (73), in "Assignee", in column 1, line 1, delete "Tecnology," and insert -- Technology, --, therefor.

Signed and Sealed this

Twenty-ninth Day of July, 2008

JON W. DUDAS
*Director of the United States Patent and Trademark Office*